United States Patent
Studer et al.

(10) Patent No.: US 11,409,527 B2
(45) Date of Patent: Aug. 9, 2022

(54) PARALLEL PROCESSOR IN ASSOCIATIVE CONTENT ADDRESSABLE MEMORY

(71) Applicant: Cornell University, Ithaca, NY (US)

(72) Inventors: Christoph Emanuel Studer, Ithaca, NY (US); Oscar Fernando Castañeda Fernandez, New York, NY (US)

(73) Assignee: Cornell University, Ithaca, NY (US)

( * ) Notice: Subject to any disclaimer, the term of this patent is extended or adjusted under 35 U.S.C. 154(b) by 8 days.

(21) Appl. No.: 16/929,463

(22) Filed: Jul. 15, 2020

(65) Prior Publication Data

US 2021/0019147 A1    Jan. 21, 2021

Related U.S. Application Data

(60) Provisional application No. 62/874,339, filed on Jul. 15, 2019.

(51) Int. Cl.
*G06F 9/30* (2018.01)
*G11C 15/04* (2006.01)
(Continued)

(52) U.S. Cl.
CPC ........ *G06F 9/30036* (2013.01); *G06F 7/5443* (2013.01); *G06F 7/57* (2013.01);
(Continued)

(58) Field of Classification Search
CPC . G11C 11/4094; G11C 15/04; G06F 9/30029; G06F 7/57; G06F 9/30036
See application file for complete search history.

(56) References Cited

U.S. PATENT DOCUMENTS

| 5,638,315 A | * | 6/1997 | Braceras | ................ | G11C 15/00 365/49.15 |
| 10,812,125 B1 | | 10/2020 | Badic et al. | | |

(Continued)

OTHER PUBLICATIONS

Terry, J. et al., "Convergence Analysis of Finite Alphabet Beamformers for Digital Cochannel Signals," IEEE Transactions on Communications, vol. 51, No. 6, Jun. 2003, IEEE, pp. 929-939.
(Continued)

*Primary Examiner* — Zachary K Huson
(74) *Attorney, Agent, or Firm* — Withrow & Terranova, P.L.L.C.

(57) ABSTRACT

A parallel processor in associative content-addressable memory (PPAC) is provided. Processing in memory (PIM) moves computation into memories with the goal of improving throughput and energy-efficiency compared to traditional von Neumann-based architectures. Most existing PIM architectures are either general-purpose but only support atomistic operations, or are specialized to accelerate a single task. The PPAC described herein provides a novel in-memory accelerator that supports a range of matrix-vector-product (MVP)-like operations that find use in traditional and emerging applications. PPAC is, for example, able to accelerate low-precision neural networks, exact/approximate hash lookups, cryptography, and forward error correction. The fully-digital nature of PPAC enables its implementation with standard-cell-based complementary metal-oxide-semiconductor (CMOS), which facilitates automated design and portability among technology nodes. A comparison with recent digital and mixed-signal PIM accelerators reveals that PPAC is competitive in terms of throughput and energy-efficiency, while accelerating a wide range of applications and simplifying development.

17 Claims, 10 Drawing Sheets

(51) Int. Cl.
  *G06F 7/57*     (2006.01)
  *G11C 11/4094*  (2006.01)
  *G06F 7/544*    (2006.01)

(52) U.S. Cl.
  CPC ...... *G06F 9/30029* (2013.01); *G06F 9/30087* (2013.01); *G11C 11/4094* (2013.01); *G11C 15/04* (2013.01)

(56) References Cited

U.S. PATENT DOCUMENTS

| | | | |
|---|---|---|---|
| 2001/0017801 A1* | 8/2001 | Helwig | G11C 15/00 365/201 |
| 2005/0024540 A1 | 2/2005 | Kim et al. | |
| 2006/0185689 A1* | 8/2006 | Crocker | E01H 1/103 134/10 |
| 2006/0269023 A1 | 11/2006 | Chimitt et al. | |
| 2008/0235311 A1 | 9/2008 | Budianu et al. | |
| 2013/0114001 A1 | 5/2013 | Kweon et al. | |
| 2018/0122456 A1* | 5/2018 | Li | G11C 11/4076 |
| 2020/0111518 A1* | 4/2020 | Ge | G11C 11/24 |

OTHER PUBLICATIONS

Wang, Z. et al., "Hybrid Precoderand Combiner Design With Low-Resolution Phase Shifters in mmWave MIMO Systems," IEEE Journal of Selected Topics in Signal Processing, vol. 12, No. 2, May 2018, IEEE, pp. 256-269.

Non-Final Office Action for U.S. Appl. No. 16/809,813, dated Dec. 9, 2020, 13 pages.

Roth, K., et al., "Achievable rate and energy efficiency of hybrid and digital beamforming receivers with low resolution ADC," IEEE Journal on Selected Areas in Communications, vol. 35, No. 9, Sep. 2017, pp. 2056-2068.

Rusek, F., et al., "Scaling up MIMO: Opportunities and challengeswith very large arrays," IEEE Signal Process Magazine, vol. 30, No. 1, Jan. 2013, pp. 40-60.

Sadhu, B., et al., A 28GHz 32-element phased-array transceiver IC with concurrent dual polarized beams and 1.4 degree beam-steering resolution for 5G communication, 2017 IEEE International Solid-State Circuits Conference, Feb. 2017, pp. 128-129.

Shah, S., et al., "Biconvex relaxation for semidefinite programming in computer vision," European Conference on Computer Vision (ECCV), Sep. 2016, pp. 717-735.

Studer, C. et al., "ASIC implementation of soft-input soft-output MIMO detection using MMSE parallel interference cancellation," IEEE Journal of Solid-State Circuits, vol. 46, No. 7, Jul. 2011, pp. 1754-1765.

Studer, C., et al., "Quantized massive MU-MIMO-OFDM uplink," IEEE Transactions on Communications, vol. 64, No. 6, Jun. 2016, pp. 2387-2399.

Swindlehurst, A.L., et al., "Millimeterwave massive MIMO: The next wireless revolution?," IEEE Communications Magazine, vol. 52, No. 9, Sep. 2014, pp. 56-62.

Zimmerman, R., "Computer arithmetic: Principles, architectures, and VLSI design," Integrated Systems Laboratory, Swiss Federal Institute of Technology (ETH), Zurich, Switzerland, Mar. 16, 1999, 26 pages.

Tuchler, M., et al.,"Minimum mean squared error equalization using a priori information," IEEE Transactions on Signal Processing, vol. 50, No. 3, Mar. 2002, pp. 673-683.

Verdu, S., "Computational complexity of optimum multiuser detection," Algorithmica, vol. 4, No. 1, Jun. 1989, pp. 303-312.

Wu, M., et al., "High-throughput data detection for massive MU-MIMO-OFDM using coordinate descent," IEEE Transactions on Circuits and Systems I: Regular Papers, vol. 63, No. 12, Dec. 2016, pp. 2357-2367.

Wu, M., et al., "Large-scale MIMO detection for 3GPP LTE: Algorithm and FPGA implementation," IEEE Journal of Selected Topics in Signal Processing, vol. 8, No. 5, Oct. 2014, pp. 916-929.

Wulf, W. A., et al., "Hitting the memory wall: Implications of the obvious,"ACM SIGARCH Computer Architecture News, vol. 23, No. 1, Mar. 1995, pp. 20-24.

Yan, H., et al., "Performance, power, and area design trade-offs in millimeter-wave transmitter beamforming architectures," IEEE Circuits and Systems Magazine, vo. 19, No. 2, May 2019, pp. 33-58.

Ando, K. et al., "BRein Memory: A Single-Chip Binary/Ternary Reconfigurable in-Memory Deep Neural Network Accelerator Achieving 1.4 TOPS at 0.6 W," IEEE Journal of Solid-State Circuits (JSSC), vol. 53, No. 4, Apr. 2018, IEEE, pp. 983-994.

Andoni, A. et al., "Near-Optimal Hashing Algorithms for Approximate Nearest Neighbor in High Dimension," Communications of the ACM, vol. 51, No. 1, Jan. 2008, pp. 117-122.

Annovi, A. et al., "Characterization of an Associative Memory Chip in 28 nm CMOS Technology," 2018 IEEE International Symposium on Circuits and Systems (ISCAS), May 27-30, 2018, Florence, Italy, 5 pages.

Aga, S. et al., "Compute Caches," 2017 IEEE International Symposium on High Performance Computer Architecture (HPCA), Feb. 4-8, 2017, Austin, TX, USA, IEEE, 12 pages.

Agrell, E., et al., "Closest point search inlattices," IEEE Transactions on Information Theory, vol. 48, No. 8, Aug. 2002, pp. 2201-2214.

Alkhateeb, A., et al., "MIMOprecoding and combining solutions for millimeter-wave systems," IEEE Communications Magazine, vol. 52, No. 12, Dec. 2014, pp. 122-131.

Arikan, E., "Channel Polarization: A Method for Constructing Capacity-Achieving Codes," IEEE International Symposium on Information Theory (ISIT), Jul. 6-11, 2008, Toronto, Canada, IEEE, pp. 1173-1177.

Author Unknown, "5G; NR; Base Station (BS) radio transmission and reception," 3GPP Technical Specification 38.104, version 15.5.0, release 15, European Telecommunications Standards Institute, May 2019, 219 pages.

Balatsoukas-Stimming, A., et al., "Neural-network optimized 1-bit precoding for massive MU-MIMO," 2019 IEEE 20th International Workshop on Signal Processing Advances in Wireless Communications, Cannes, France, Jul. 2-5, 2019, 5 pages.

Bankman, D. et al., "An always-on 3.8 J/86% CIFAR-10 mixed-signal binary CNN processor with all memory on chip in 28nm CMOS," IEEE Journal of Solid-State Circuits, Feb. 11-15, 2018, San Francisco, CA, USA, pp. 222-224.

Beck, A., et al., "A fast iterative shrinkage-thresholding algorithm for linear inverse problems," Society for Industrial and Applied Mathematics Journal on Imaging Sciences, vol. 2, No. 1, Jan. 2009, pp. 183-202.

Björnson, E., et al., "Massive MIMO in sub-6 GHz and mmWave: Physical, practical, and use-case differences," IEEE Wireless Communications Magazine, vol. 26, No. 2, Apr. 2019, pp. 100-108.

Castañeda, O., et al., "1-bit massive MU-MIMO precoding in VLSI," IEEE Journal on Emerging and Selected Topics in Circuits and Systems, vol. 7, No. 4, Dec. 2017, pp. 508-522.

Castañeda, O., et al., "Data detection in large multi-antenna wireless systems via approximate semidefinite relaxation," IEEE Transactions on Circuits and Systems I: Regular Papers, vol. 63, No. 12, Dec. 2016, pp. 2334-2346.

Castañeda, O., et al., "PPAC: A versatile in-memory accelerator for matrix-vector-product-like operations," 2019 IEEE 30th International Conference on Application-specific Systems, Architectures and Processors, New York, NY, Jul. 15-17, 2019, 8 pages.

Castañeda, O., et al., "VLSI design of a 3-bit constant-modulus precoder for massive MU-MIMO," 2018 IEEE International Symposium on Circuits and Systems, Florence, Italy, May 4, 2018, 5 pages.

Chang, T.-H., et al., "A linear fractional semidefinite relaxation approach to maximum-likelihood detection of higher-order QAM OSTBC in unknown channels," IEEE Transactions on Signal Processing, vol. 58, No. 4, Apr. 2010, pp. 2315-2326.

Conti, F. et al., "XNOR Neural Engine: a Hardware Accelerator IP for 21.6 fJ/op Binary Neural Network Inference," EEE Transactions on Computer-Aided Design of Integrated Circuits and Systems, vol. 37, Issue 11, Nov. 2018, IEEE, 11 pages.

(56) References Cited

OTHER PUBLICATIONS

Daemen, J. et al., "The Design of Rijndael: AES—The Advanced Encryption Standard," Springer-Verlag Berlin Heidelberg GmbH, 2002, 243 pages.
Dutta, S., et al., "A case for digital beamforming at mmWave," Jan. 24, 2019, https://arxiv.org/pdf/1901.08693.pdf, 30 pages.
Eckert, C. et al., "Neural Cache: Bit-Serial In-Cache Acceleration of Deep Neural Networks," IEEE Micro, vol. 39, Issue 3, May-Jun. 2019, IEEE, 6 pages.
Fatema, N., et al., "Massive MIMO linear precoding: A survey," IEEE Systems Journal, vol. 12, No. 4, Dec. 2018, pp. 3920-3931.
Fincke, U., et al., "Improved methods for calculating vectors of short length in a lattic, including a complexity analysis," Mathematics of Computation, vol. 44, No. 170, Apr. 1985, pp. 463-471.
Goldstein, T., et al., "Afield guide toforward-backward splitting with a FASTA implementation," https://arxiv.org/pdf/1411.3406v1.pdf, Nov. 12, 2014, 17 pages.
Goldstein, T., et al., "High-order methods for basis pursuit," UCLA Computational Applied Mathematics (CAM) Report, Jul. 2010, 17 pages.
Goldstein, T. et al., "The STONE Transform: Multi-Resolution Image Enhancement and Compressive Video," IEEE Transactions on Image Processing, vol. 24, Issue 12, Dec. 2015, IEEE, 13 pages.
Guo, Q., et al., "AC-DIMM: Associative computing with STT-MRAM," ACM SIGARCH Computer Architecture News, vol. 41, No. 3, Jun. 2013, pp. 189-200.
Hubara, I. et al., "Binarized Neural Networks," Proceedings of the 30th International Conference on Neural Information Processing Systems (NIPS 2016), Dec. 2016, Barcelona, Spain, 9 pages.
Jacobsson, S. et al., "Nonlinear 1 -bit precoding for massive MU-MIMO with higher order modulation," 2016 50th Asilomar Conference on Signals, Systems and Computers, Nov. 6-9, 2018, Pacific Grove, CA, pp. 763-767.
Jacobsson, S., et al., "Quantized precoding for massive MU-MIMO," IEEE Transactions on Communications, vol. 35, No. 11, Nov. 2017, pp. 4670-4684.
Jacobsson, S., et al., "Throughput analysis of massive MIMO uplink with low-resolution ADCs," IEEE Transactions on Wireless Communications, vol. 16, No. 6, Jun. 2017, pp. 4038-4051.
Jaeckel, S., et al., "QuaDRiGa: A3-D multi-cell channel model with time evolution for enabling virtual field trials," IEEE Transactions on Antennas and Propagation, vol. 62, No. 6, Jun. 2014, pp. 3242-3256.
Jia, H., et al., "A microprocessor implemented in 65nm CMOS with configurable and bit-scalable accelerator for programmable in-memory computing," https://arxiv.org/ftp/arxiv/papers/1811/1811.04047.pdf, Nov. 2018, 10 pages.
Joham, M., et al., "Linear transmit processing in MIMO communications systems," IEEE Transactions on Signal Processing, vol. 53, No. 8, Aug. 2005, pp. 2700-2712.
Kim, D. et al., "Neurocube: A Programmable Digital Neuromorphic Architecture with High-Density 3D Memory," ACM/IEEE 43rd Annual International Symposium on Computer Architecture (ISCA), Jun. 18-22, 2016, Seoul, South Korea, IEEE Computer Society, pp. 380-392.
Larsson, E.G., et al., "Massive MIMO for next generation wireless systems," IEEE Communications Magazine, vol. 52, No. 2, Feb. 2014, pp. 186-195.
Lee, J. et al., "UNPU: An Energy-Efficient Deep Neural Network Accelerator With Fully Variable Weight Bit Precision," IEEE Journal of Solid-State Circuits, vol. 54, Issue 1, Jan. 2019, pp. 173-185.
Li, S., et al., "DRISA: A DRAM-based reconfigurable in-situ accelerator," 5-th Annual IEEE/ACM Sympoium on Microartchitecture, Oct. 14-18, 2017, Cambridge, MA, pp. 288-301.
Luo, Z., et al., "Semidefinite relaxation of quadratic optimization problems," IEEE Signal Processing Magazine, vo. 27, No. 3, May 2010, pp. 20-34.
Mo, J., et al., "Capacity analysis of one-bit quantized MIMO systems with transmitter channel state information," IEEE Transactions on Signal Processing, vol. 63, No. 20, Oct. 15, 2015, pp. 5498-5512.
Mo. J., et al., "Hybrid architectures with few-bit ADC receivers: Achievable rates and energy rate tradeoffs," IEEE Transactions on Wireless Communications, vol. 16, No. 4, Apr. 2017, pp. 2274-2287.
Nair, R., "Evolution of memory architecture," Proceedings of the IEEE, vol. 103, No. 8, Aug. 2015, pp. 1331-1345.
Pagiamtzis, K. et al., "Content-Addressable Memory (CAM) Circuits and Architectures: A Tutorial and Survey," IEEE Journal of Solid-State Circuits, vol. 41, No. 3, Mar. 2006, IEEE, pp. 712-727.
Parikh, N., et al., "Proximal algorithms," Foundations and Trends in Optimization, vol. 1, No. 3, 2013, pp. 123-231.
Zhang, M. et al., "Highly-Associative Caches for Low-Power Processors," Kool Chips Workshop, 33rd International Symposium on Microarchitecture, Dec. 2000, Monterey, CA, 6 pages.
Pei, T.-B. et al., "VLSI Implementation of Routing Tables: Tries and CAMs," Conference on Computer Communications, Tenth Annual Joint Conference of the IEEE Computer and Communications Societies Proceedings, Apr. 7-11, 1991, Bal Harbour, FL, USA, IEEE, pp. 0515-0524.
Petersen, K. B., et al., "The matrix cookbook," Nov. 15, 2012, 72 pages.
Pi, Z., et al., "An introduction to millimeter-wave mobile broadband systems," IEEE Communications Magazine, vol. 49, No. 6, Jun. 2011, pp. 101-107.
Rappaport, T.S., et al., "Millimeter wavemobile communications for 5G cellular: It will work!," IEEE Access, vol. 1, May 2013, pp. 335-349.
Roh, W., et al., "Millimeter-wave beamforming as an enabling technology for 5G cellular communications: Theoretical feasibility and prototyperesults," IEEE Communications Magazine, vol. 52, No. 2, Feb. 2014, pp. 106-113.

* cited by examiner

PARALLEL PROCESSOR IN ASSOCIATIVE CONTENT ADDRESSABLE MEMORY

RELATED APPLICATIONS

This application claims the benefit of provisional patent application Ser. No. 62/874,339, filed Jul. 15, 2019, the disclosure of which is hereby incorporated herein by reference in its entirety.

GOVERNMENT SUPPORT

This invention was made with government funds under Agreement No. HR0011-18-3-0004 awarded by The Defense Advanced Research Projects Agency (DARPA). The U.S. Government has certain rights in this invention.

FIELD OF THE DISCLOSURE

The present disclosure relates to circuit design and, in particular, to circuits that perform data processing in memory.

BACKGROUND

Traditional von Neumann-based architectures have taken a variety of forms that trade-off flexibility with hardware efficiency. For example, central processing units (CPUs) are able to compute any given task that can be expressed as a computer program. In contrast, application-specific integrated circuits (ASICs) are specialized to accelerate a single task but achieve (often significantly) higher throughputs and superior energy-efficiency. In between reside graphics processing units (GPUs) and field-programmable gate arrays (FPGAs) that are more specialized than CPUs, but typically offer higher throughput and energy-efficiency for the supported tasks.

FIG. 1 is a schematic block diagram of a traditional computing system 10. The traditional computing system 10 includes a general processor 12 (e.g., a CPU, a GPU, an FPGA, or an ASIC) and a memory 14 connected via a system bus 16, which also allows for connection to additional components, such as peripheral devices (e.g., input/output devices, such as a keyboard, mouse, display, etc.). Under traditional von Neumann architecture, the general processor 12 incorporates all system control 18, arithmetic logic unit(s) (ALU(s)) 20, and logic circuitry 22 for performing computing tasks. Meanwhile, the memory 14 stores instructions and data for processing by the processor 12.

Due to this architectural separation between the processor 12 (and its system control 18, ALU(s) 20, and logic circuitry 22) and the memory 14, there is an ever-growing gap between computing performance and memory access times such that von Neumann-based computing systems have hit a so-called "memory wall" in which most of a system's bandwidth, energy, and time is consumed by memory operations. This problem is further aggravated with the rise of applications, such as machine learning, data mining, or Fifth Generation (5G) wireless systems, where massive amounts of data need to be processed at high rates and in an energy-efficient way.

SUMMARY

A parallel processor in associative content-addressable memory (PPAC) is provided. Processing in memory (PIM) moves computation into memories with the goal of improving throughput and energy-efficiency compared to traditional von Neumann-based architectures. Most existing PIM architectures are either general-purpose but only support atomistic operations, or are specialized to accelerate a single task. The PPAC described herein provides a novel in-memory accelerator that supports a range of matrix-vector-product (MVP)-like operations that find use in traditional and emerging applications. PPAC is, for example, able to accelerate low-precision neural networks, exact/approximate hash lookups, cryptography, and forward error correction.

The fully-digital nature of PPAC enables its implementation with standard-cell-based complementary metal-oxide-semiconductor (CMOS), which facilitates automated design and portability among technology nodes. To demonstrate the efficacy of PPAC, post-layout implementation results in 28 nm CMOS are described herein for different array sizes. A comparison with recent digital and mixed-signal PIM accelerators reveals that PPAC is competitive in terms of throughput and energy-efficiency, while accelerating a wide range of applications and simplifying development.

An exemplary embodiment provides a parallel processor, comprising: a plurality of bit cells, each bit cell comprising: an addressable memory bit; and a first addressable logic operator connected to the addressable memory bit; and a first arithmetic logic unit (ALU) configured to compute a first function of outputs from the first addressable logic operators of the plurality of bit cells.

In some examples, the first function of the first ALU is configurable from a group of functions.

In some examples, the first ALU is further configured to compute a second function in parallel time with the first function.

In some examples, the first ALU is further configured to compute a second function in serial time with the first function.

In some examples, the first function of the first ALU comprises a programmable threshold function.

In some examples, the plurality of bit cells comprises a first row of bit cells; and the first ALU is connected to the first row of bit cells. In some examples, the first function of the first ALU comprises a MVP operation. In some examples, the first row of bit cells comprises a plurality of subrows, each subrow having an adder connected to the first ALU. In some examples, the plurality of bit cells further comprises a second row of bit cells; and the parallel processor further comprises a second ALU connected to the second row of bit cells. In some examples, the first ALU and the second ALU are configured to provide a MVP operation. In some examples, the MVP operation is a single-bit MVP. In some examples, the MVP operation is a multi-bit MVP from a multi-bit matrix. In some examples, the plurality of bit cells further comprises a plurality of banks, each having a plurality of rows and a bank adder connected to the plurality of rows; and a first bank of the plurality of banks comprises the first row of bit cells and the second row of bit cells.

In some examples, the first addressable logic operator comprises XNOR, XOR, OR, NOR, AND, or NAND.

In some examples, each bit cell further comprises a second addressable logic operator coupled to the addressable memory bit. In some examples, the first addressable logic operator comprises XNOR; and the second addressable logic operator comprises OR, AND, or NAND. In some examples, each bit cell further comprises a multiplexer selectively providing a corresponding output from the first addressable logic operator or the second addressable logic operator. In some examples, the first addressable logic operator comprises an XNOR gate; the second addressable logic operator comprises an AND gate; and the multiplexer is coupled to the XNOR gate, the AND gate, and a control signal input. In some examples, the XNOR gate performs a first bitwise multiplication $\{\pm 1\}$ between an input bit and a stored bit; and the AND gate performs a second bitwise multiplication $\{0, 1\}$ between the input bit and the stored bit. In some examples, the first function of the first ALU comprises computing a sum of results from the first bitwise multiplication or the second bitwise multiplication.

In some examples, each bit cell further comprises a clock gate configured for writing to the addressable memory bit.

In some examples, the plurality of bit cells is disposed on a common die. In some examples, the first ALU is disposed on the common die. In some examples, the first ALU is disposed on a separate die.

In some examples, an integrated circuit comprises the parallel processor.

In some examples, the parallel processor further comprises a memory module comprising the addressable memory bits of the plurality of bit cells; and a processing module communicatively coupled to the memory module and comprising the first ALU and additional ALUs. In some examples, the processing module further comprises the first addressable logic operators of the plurality of bit cells.

In some examples, at least some of the plurality of bit cells are latch-based bit cells.

Another exemplary embodiment provides a memory device for performing logical operations, the memory device comprising: a plurality of rows of bit cells comprising content-addressable memory; and a plurality of row ALUs, each row ALU being communicatively coupled to a respective one of the plurality of rows of bit cells, wherein each row ALU is configured to perform an operation on outputs from the respective one of the plurality of rows of bit cells.

In some examples, each of the plurality of rows of bit cells is subdivided into a plurality of subrows. In some examples, each row ALU adds incoming local population counts of all subrows in the respective row and computes the operation based on a total population count of bit cell results for the respective row. In some examples, the memory device further comprises a plurality of subrow adders to perform a population count for each respective subrow of the plurality of subrows.

In some examples, the memory device further comprises a plurality of memory banks, each comprising a subset of the plurality of rows of bit cells; and a plurality of bank adders to sum an output from respective ALUs in each of the plurality of memory banks.

Another exemplary embodiment provides a method for performing logic functions in memory, the method comprising: performing a bit-wise logic operation on data stored on an array of addressable memory cells having M rows of N bits; and in parallel at each of the M rows, performing an arithmetic logic function on N corresponding outputs from the bit-wise logic operation.

In some examples, the bit-wise logic operation comprises a Hamming similarity computation.

In some examples, the bit-wise logic operation further comprises an inner-product computation.

In some examples, the arithmetic logic function comprises a sum of the N corresponding outputs.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
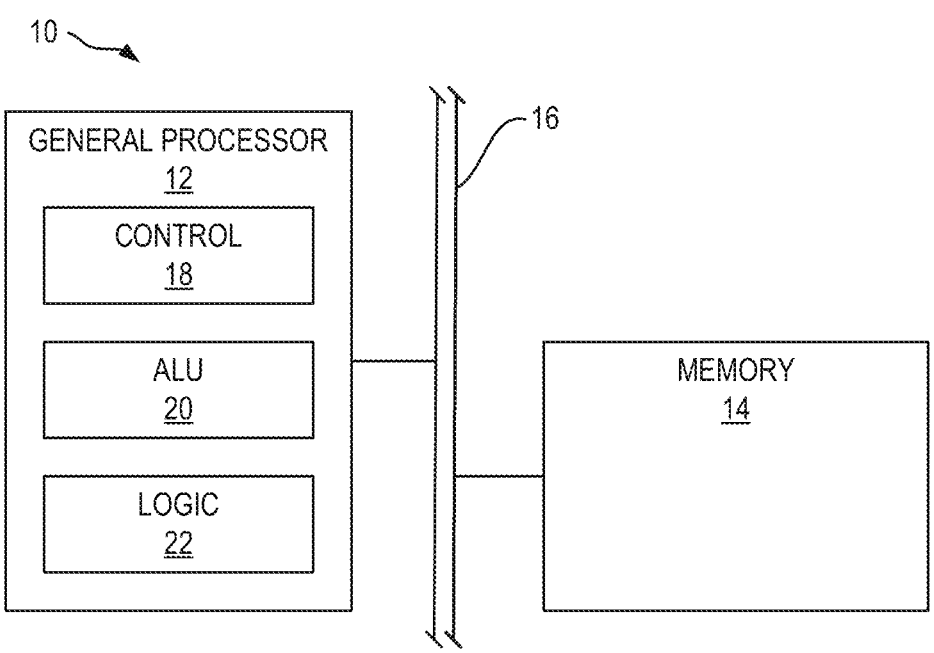
FIG. 1 is a schematic block diagram of a traditional computing system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A parallel processor in associative content-addressable memory (PPAC) is provided. Processing in memory (PIM) moves computation into memories with the goal of improving throughput and energy-efficiency compared to traditional von Neumann-based architectures. Most existing PIM architectures are either general-purpose but only support atomistic operations, or are specialized to accelerate a single task. The PPAC described herein provides a novel in-memory accelerator that supports a range of matrix-vector-product (MVP)-like operations that find use in traditional and emerging applications. PPAC is, for example, able to accelerate low-precision neural networks, exact/approximate hash lookups, cryptography, and forward error correction.

The fully-digital nature of PPAC enables its implementation with standard-cell-based complementary metal-oxide-semiconductor (CMOS), which facilitates automated design and portability among technology nodes. To demonstrate the efficacy of PPAC, post-layout implementation results in 28 nm CMOS are described herein for different array sizes. A comparison with recent digital and mixed-signal PIM accelerators reveals that PPAC is competitive in terms of throughput and energy-efficiency, while accelerating a wide range of applications and simplifying development.

Section headings are used in the present document only for improving readability and do not limit the scope of techniques or embodiments described herein. As such, techniques and embodiments described under a given section heading may be combined together with teachings of different section headings.

I. Introduction

As described above, the ever-growing gap between computing performance and memory access times has lead today's von Neumann-based computing systems to hit a so-called "memory wall", where most of a system's bandwidth, energy, and time is consumed by memory operations. This problem is further aggravated with the rise of applications, such as machine learning, data mining, or Fifth Generation (5G) wireless systems, where massive amounts of data need to be processed at high rates and in an energy-efficient way.

A. Processing in Memory

PIM is an emerging computing paradigm that promises to tear down the memory wall. For example, PIM brings computation closer to memory, with the objective of reducing the time and energy of memory accesses, which ultimately increases a circuit's overall efficiency. The application of PIM to general-purpose processors has been explored recently. While such PIM-aided central processing units (CPUs) enable improved throughput and energy-efficiency for certain memory-intensive workloads, the supported PIM operations are typically limited to atomistic operations (such as bit-wise AND/NOR). As a consequence, executing even slightly more complex operations (such as multi-bit additions or multiplications) requires a repeated use of the supported PIM operations; this prevents such architectures from reaching the throughput and energy-efficiency required in many of today's applications.

Hence, a number of PIM-based application-specific integrated circuits (ASICs) have been explored recently. Such solutions generally excel in throughput and energy-efficiency, but have limited applicability, often accelerating a single task only. For example, a PIM-ASIC may be designed to accelerate neural network inference using mixed-signal techniques, but may suffer from effects caused by noise and process variation; this prevents its use in applications in which the least significant bit must be computed accurately (e.g., in cryptography, forward error correction, or locality-sensitive hashing).

B. Example Features of the Present Disclosure

While a range of PIM-based ASICs and CPUs have been proposed in recent years, no PIM-based solutions exist that simultaneously offer high flexibility and high efficiency. The PPAC described herein provides a PIM-based hardware solution (an in-memory accelerator that performs computation directly in the memory array, instead of moving data between memory and the data-path) with a novel, versatile in-memory parallel processor which supports a range of MVP-like operations. Embodiments of the PPAC are designed entirely in digital standard-cell-based CMOS, accelerate some of the key operations in a wide range of traditional and emerging applications, and achieve high throughput and energy-efficiency for the supported tasks.

In an exemplary aspect, the proposed architecture include a two-dimensional array of latch-based bit cells that support two or more types of binary-valued operations (e.g., XNOR and AND); each row of the PPAC array is equipped with a row arithmetic-logic unit (ALU) that supports a variety of tasks, including content-addressable memory (CAM) functionality, Hamming-distance calculation, one- and multi-bit MVPs, Galois field of two elements (GF(2)) MVPs, and programmable logic array (PLA) functionality.

Embodiments described herein can be used (among many other examples) for (i) low-precision MVPs, which find use in spatial equalization of millimeter-wave (mmWave) or terahertz (THz) communications systems, (ii) low-precision neural networks, which find use in real-time inference on battery-powered devices or self-driving cars, (iii) cryptography acceleration, which finds use in secure processors, networking applications, or general-purpose processors, (iv) decoding of error-correcting codes, which are used in communications systems and storage devices (e.g., hard-drives or flash storage), (v) intelligent CAMs, which can be used for network routing or nearest neighbor search using locality sensitive hashing, and (vi) arbitrary Boolean functions, which find use in programmable hardware fabrics such as field-programmable gate arrays (FPGAs) or PLAs.

In Section II, example operating principles and architecture of PPAC are described. Section III details a number of operation modes and potential use cases for the PPAC. Section IV presents a post-layout implementation in 28 nanometer (nm) CMOS technology. Area, throughput, and energy-efficiency results of this implementation are compared with recent related accelerators. Section V describes an exemplary process for performing logic functions in memory according to embodiments of the PPAC. Section VI presents an embodiment of the PPAC implemented in a wireless communications system.

II. PPAC: Parallel Processor in Associative CAM

Figure 2A:
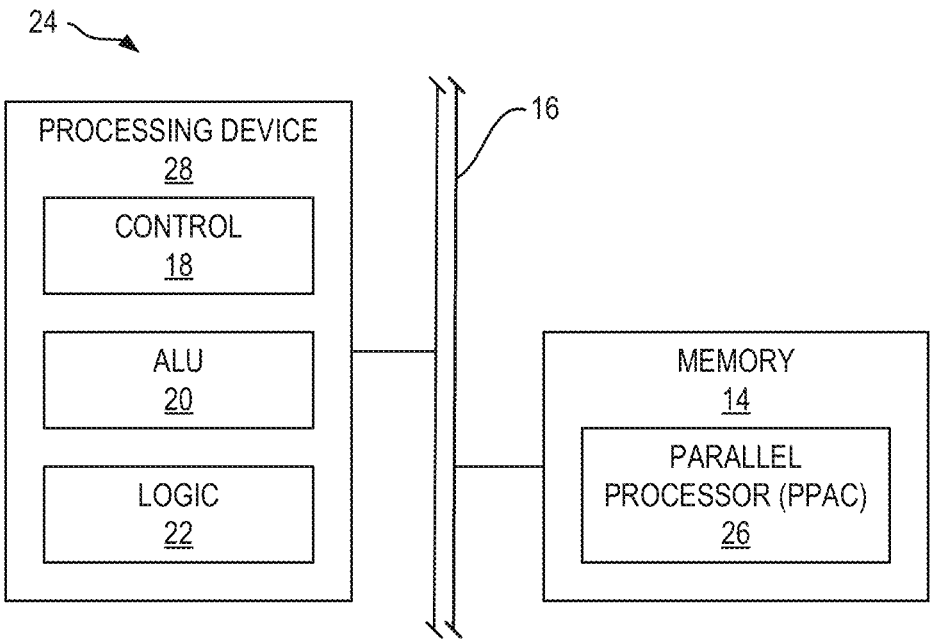
FIG. 2A is a schematic block diagram of an exemplary computing system incorporating a parallel processor in associative content-addressable memory (PPAC) according to embodiments described herein.

FIG. 2A is a schematic block diagram of an exemplary computing system 24 incorporating a PPAC 26 according to embodiments described herein. The computer system 24 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

Similar to the traditional computing system 10 of FIG. 1, the computing system 24 includes a processing device 28 or processor, a memory 14, and a system bus 16. The system bus 16 provides an interface for system components including, but not limited to, the memory 14 and the processing device 28. The system bus 16 may be any of several types of bus structures that may further interconnect to a memory bus (with or without a memory controller), a peripheral bus, and/or a local bus using any of a variety of commercially available bus architectures. An operator, such as a user, may also be able to enter data and/or one or more configuration commands to the computing system 24 through a keyboard, a pointing device such as a mouse, or a touch-sensitive surface, such as a display device, via an input device interface (omitted from FIG. 2A) or remotely through a web interface, terminal program, or the like via a wired or wireless communication interface (e.g., as illustrated in FIG. 8). Additional inputs and outputs to the computing system 24 may be provided through the system bus 16 as appropriate to implement embodiments described herein.

The processing device 28 represents one or more commercially available or proprietary general-purpose processing devices, such as a microprocessor, CPU, or the like. The processing device 28 is configured to execute processing logic instructions for performing operations and steps which may be stored in the memory 14. In this regard, the computing system 24 may be implemented with a microprocessor, FPGA, a digital signal processor (DSP), an ASIC, or other programmable logic device, a discrete gate or transistor logic, discrete hardware components, or any combination thereof.

The memory 14 may include non-volatile memory (e.g., read-only memory (ROM), erasable programmable ROM (EPROM), electrically EPROM (EEPROM), and the like) and volatile memory (e.g., random-access memory (RAM), such as dynamic RAM (DRAM) or synchronous DRAM (SDRAM)). In some examples, an operating system and/or any number of program modules or other applications can be stored in the memory 14, wherein the program modules represent a wide array of computer-executable instructions corresponding to programs, applications, functions, and the like that may implement the functionality described herein in whole or in part, such as through instructions on the processing device 28.

In an exemplary aspect, the memory 14 further includes a parallel processor, or PPAC 26, to flexibly perform computation directly in the memory 14, instead of moving all data between the memory and the processing device 28 for logic operations and/or other computation.

Figure 2B:
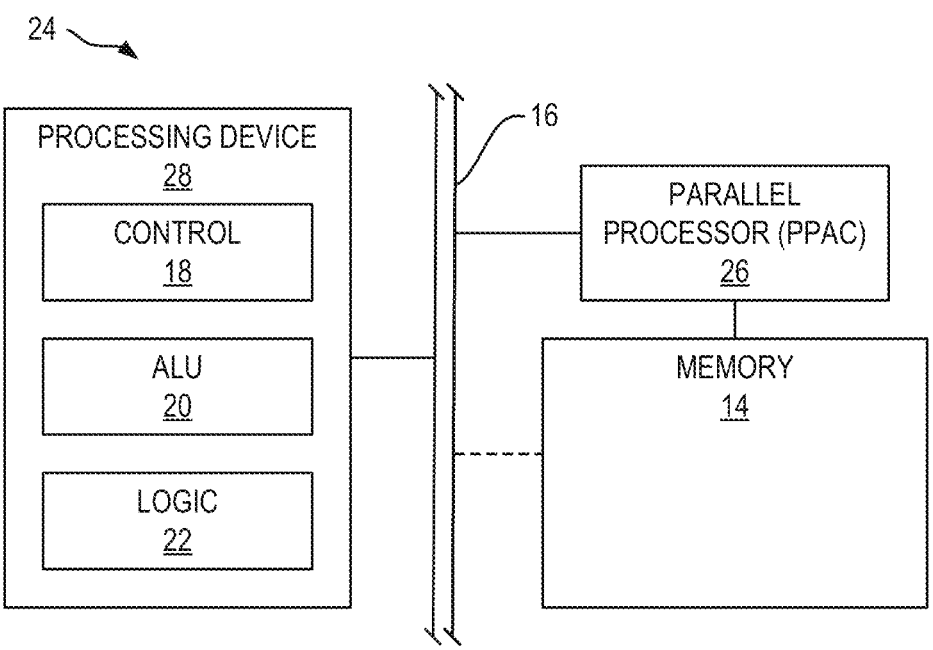
FIG. 2B is a schematic block diagram of an alternative computing system incorporating the PPAC of FIG. 2A.

FIG. 2B is a schematic block diagram of an alternative computing system 24 incorporating the PPAC 26 of FIG. 2A. In the example of FIG. 2B, the PPAC 26 is implemented adjacent but separate from the memory 14. For example, the PPAC 26 may be directly connected to the memory 14, such that some or all memory operations are passed through the PPAC 26. In some examples, the memory 14 may also be connected to the system bus 16 such that some memory operations may bypass the PPAC 26.

Below are described non-limiting examples of operating techniques of PPAC 26 and example PPAC 26 architectures. In what follows, the terms "word" and "vector" will be used interchangeably—an N-bit word can also be interpreted as a binary-valued vector of dimension N.

A. Examples of Operational Techniques

Embodiments of the PPAC 26 build upon CAMs, which are memory arrays that compare all of their M stored N-bit words $a_m$, m=1, ..., M, with an N-bit input word x to determine the set of stored words that match the input. Conceptually, the functionality of a CAM can be described as a memory in which every bit cell contains an XNOR gate to determine whether the stored value $a_{m,n}$ matches the input bit $x_n$, n=1, ..., n. A match is then declared only if all the N bits in $a_m$ match with the N bits of the input x. Mathematically, the functionality of a CAM can be expressed in terms of the Hamming distance $h(a_m, x)$, which indicates the number of bits in which $a_m$ and x differ. A CAM declares a match between the stored word $a_m$ and the input word x if $h(a_m, x) = 0$.

Figure 3:
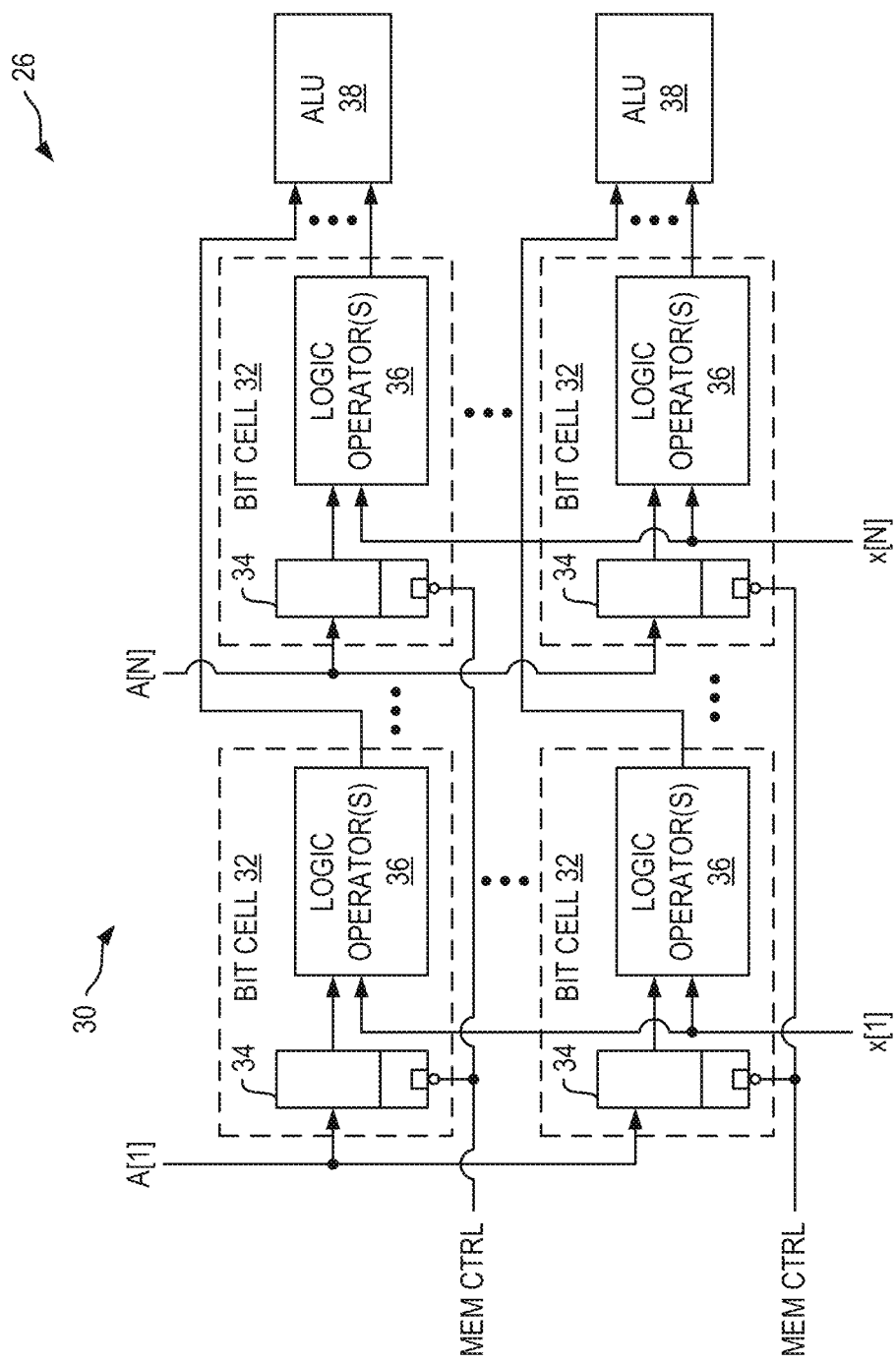
FIG. 3 is a schematic block diagram of a generalized architecture of the PPAC of FIGS. 2A and 2B.

FIG. 3 is a schematic block diagram of a generalized architecture for the PPAC 26 of FIGS. 2A and 2B. The PPAC 26 includes a CAM 30 with an array of bit cells 32. Each bit cell 32 includes one or more addressable memory bits 34 and one or more addressable logic operators 36 connected to the addressable memory bit(s) 34. The illustrated embodiment includes a single addressable memory bit 34 per bit cell 32, but in some embodiments each bit cell 32 may include multiple addressable memory bits 34 (e.g., arranged in a shift register or as a shadow register). The PPAC 26 builds upon a CAM 30 that is able to compute the Hamming distance by including the one or more addressable logic operators 36 (for example, including an additional logic operator besides the XNOR gate) and a simple ALU 38 which computes a function of outputs from the addressable logic operators 36. It should be understood that the addressable logic operators 36 can be any combination of logic operators, such as OR, XOR, NOR, NOT, AND, XOR, and/or NAND. The ALU 38 enables a wide range of applications for computing logical operations from data stored in the bit cells 32.

Figure 4:
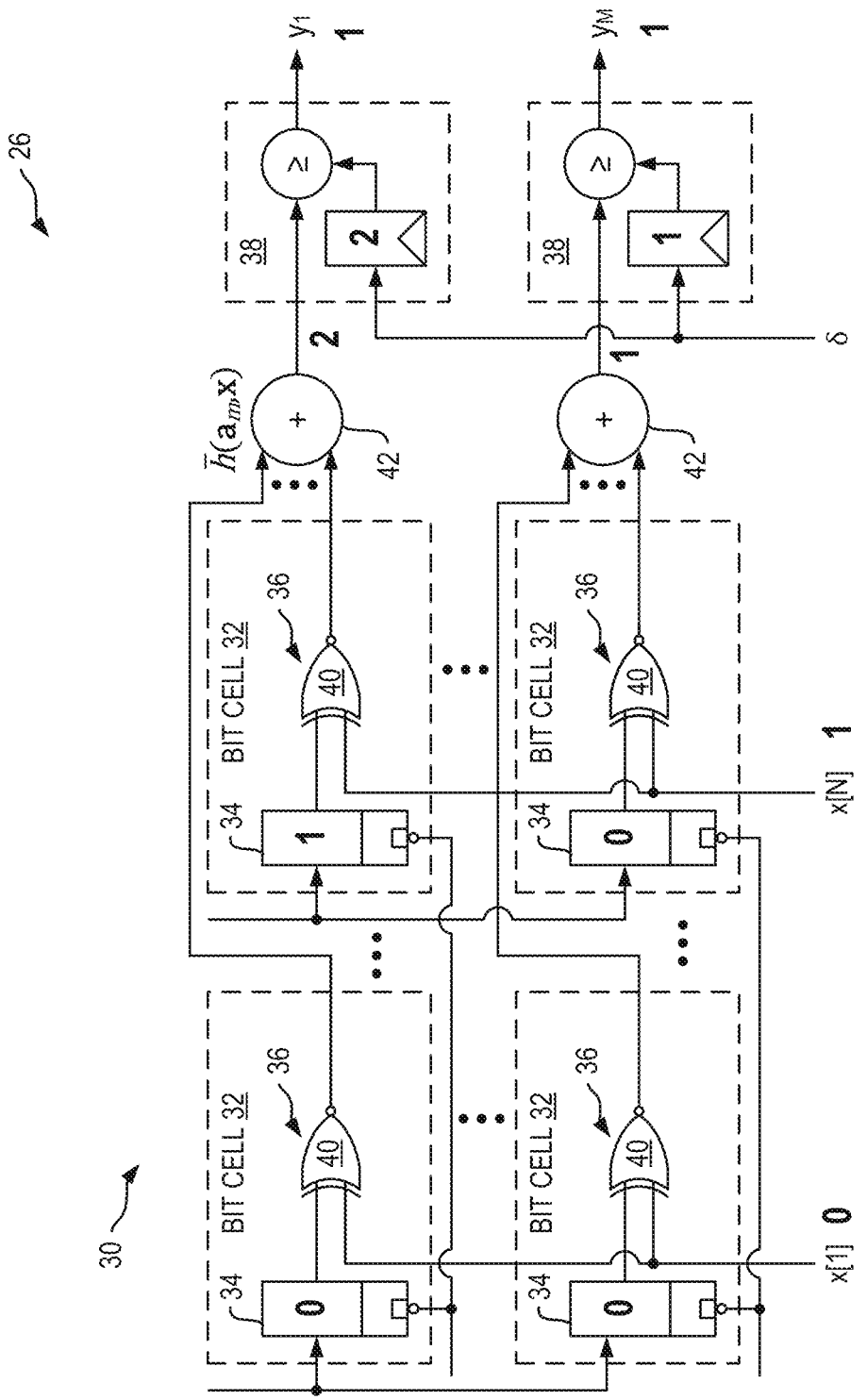
FIG. 4 is a schematic block diagram of an exemplary embodiment of the PPAC of FIG. 3.

FIG. 4 is a schematic block diagram of an exemplary embodiment of the PPAC 26 of FIG. 3. In this embodiment, the CAM 30 can compute the Hamming similarity, defined as $\bar{h}(a_m,x)=N-h(a_m,x)$, which corresponds to the number of bits that are equal between the words $a_m$ and x. In this regard, each bit cell 32 includes an XNOR gate 40 as an addressable logic operator 36, and the Hamming similarity is computed during a single clock cycle by performing a population count with an adder 42 that counts the number of ones over all XNOR gate 40 outputs of the bit cells 32 of a word.

In the example of FIG. 4, the ALU 38 implements a threshold function, by comparing an output of the adder 42 with a stored programmable threshold δ. Since $\bar{h}(a_m,x)$ is available, the PPAC 26 can therefore implement not only a standard complete-match CAM that declares a match whenever $\bar{h}(a_m,x)=N$, but also a similarity-match CAM 30 that declares a match whenever the number of equal bits between $a_m$ and x meets the programmable threshold δ; i.e., $\bar{h}(a_m,x) \geq \delta$. As described further below, this similarity-match functionality finds use in different applications.

It is important to realize that with the availability of the Hamming similarity $\bar{h}(a_m,x)$, embodiments of the PPAC 26 can also compute an inner-product between the vectors $a_m$ and x. Assume that the entries of the N-dimensional binary-valued vectors $a_m$ and x are defined as follows: If the nth bit has a logic high (HI) value, then the nth entry represents a+1; if the nth bit has a logic low (LO) value, then the nth entry represents a−1. For this mapping, the inner-product between $a_m$ and x is $$\langle a_m,x \rangle = \Sigma_{n=1}^{N} a_{m,n} x_n = 2\bar{h}(a_m,x) - N \qquad \text{Equation 1}$$

To see this, note that each partial product $a_{m,n}x_n$ is +1 if $a_{m,n}=x_n$ and −1 if $a_{m,n} \neq x_n$; this partial product can be computed with an XNOR. If all N entries of $a_m$ and x differ, then $\langle a_m,x \rangle = -N$. Otherwise, for each bit n for which $a_{m,n}=x_n$, the partial product $a_{m,n}x_n$ changes from −1 to +1, increasing $\langle a_m,x \rangle$ by 2. As the total number of bits that are equal between $a_m$ and x is given by $\bar{h}(a_m,x)$, it follows that $\langle a_m,x \rangle$ can be computed in accordance with Equation 1. Note that the PPAC 26 can compute $\langle a_m,x \rangle$ in parallel for all the stored words $a_m$, m=1, ..., M, which is exactly a 1-bit MVP Ax between the matrix A (whose rows are the words $a_m$) and the input vector x. Such MVPs can be computed in a single clock cycle.

As will be further shown in Section III, embodiments of the PPAC 26 can compute multi-bit MVPs bit-serially over several clock cycles. Furthermore, while the XNOR gate 40 was used to multiply {±1} entries, an AND gate can be included in each bit cell 32 to enable the multiplication of {0,1} entries. With this AND functionality, embodiments of the PPAC 26 can additionally perform (i) operations in GF(2), (ii) standard unsigned and 2's-complement signed arithmetic, and (iii) arbitrary Boolean functions in a similar fashion to a PLA.

B. Examples of Architecture Details

Figure 5:
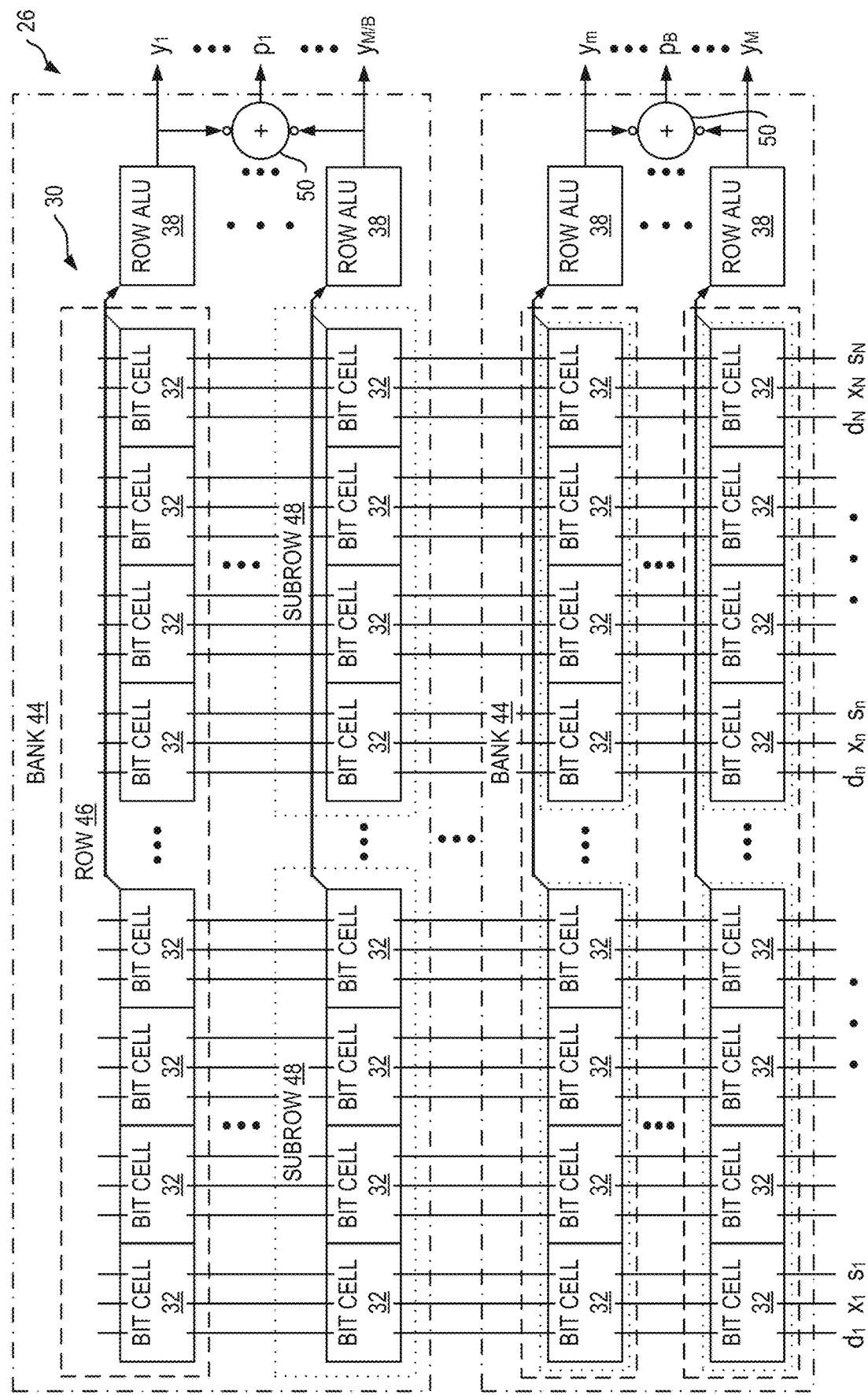
FIG. 5 is a high-level schematic block diagram of another embodiment of the PPAC of FIG. 3.

FIG. 5 is a high-level schematic block diagram of another embodiment of the PPAC 26 of FIG. 3. The high-level architecture includes multiple banks 44, each containing multiple rows 46. Each of the M rows 46 of the PPAC 26 stores an N-bit word in a subrow 48 of its memory and is equipped with a row ALU 38. The row ALU 38 adds the N one-bit results coming from all of the bit cells 32 on the row 46 using a population count. The row population count is then used to perform different operations in the row ALU 38, such as Hamming-similarity or inner-product computation. Finally, each of the B banks 44 contains a population count (e.g., with a bank adder 50) that sums up the negation of the most significant bits (MSBs) of all the row ALU 38 outputs. As detailed in Section III-E, this operation enables the PPAC 26 to implement PLA functionality.

Figure 6A:
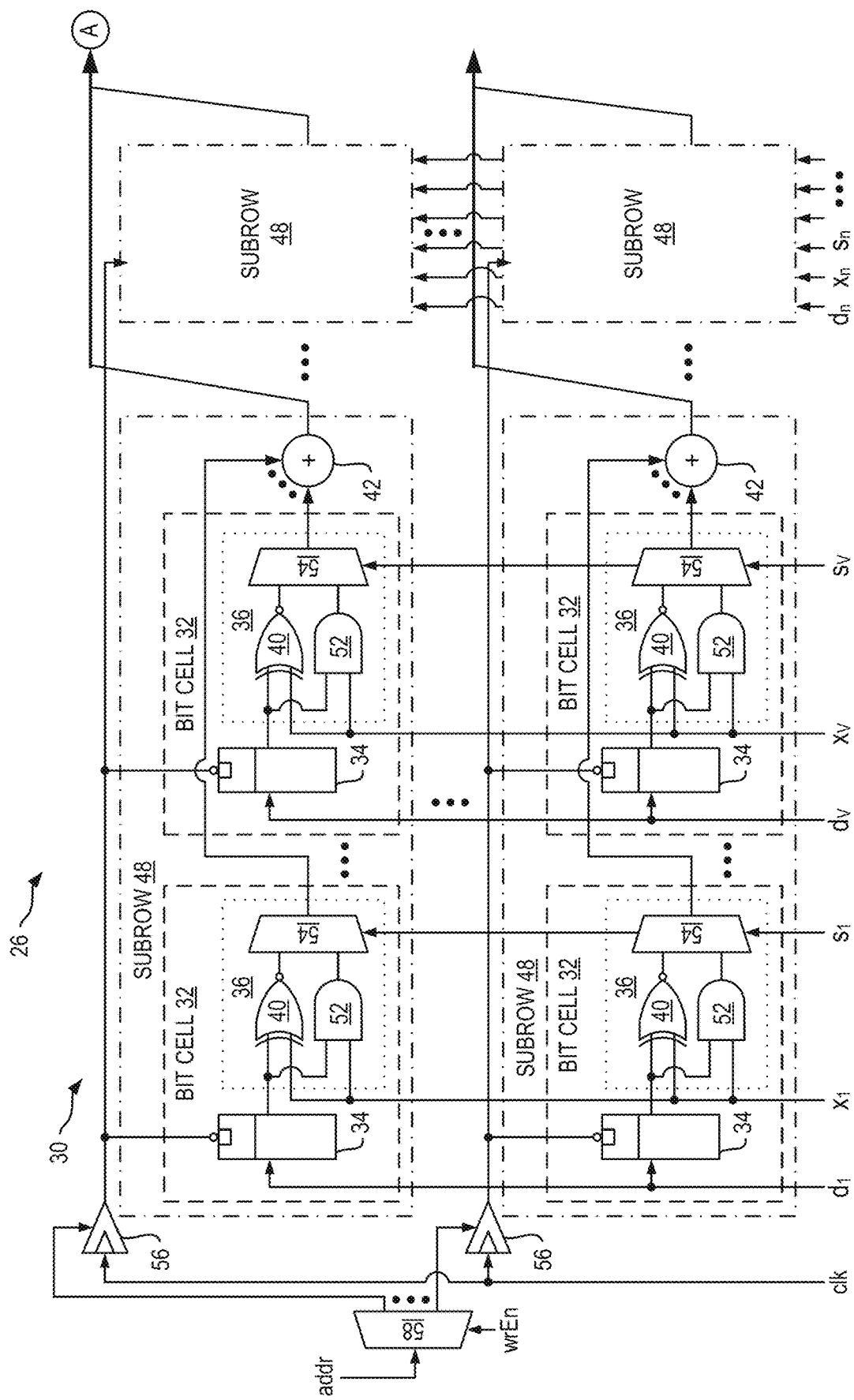
FIG. 6A illustrates details of bit cells and subrows of the embodiment of the PPAC of FIG. 5.

FIG. 6A illustrates details of bit cells 32 and subrows 48 of the embodiment of the PPAC 26 of FIG. 5. All of the bit cells 32 corresponding to the nth bit position in all words m=1, ..., M share three input signals: (i) $d_n$ is the bit that will be stored in the bit cell 32, (ii) $x_n$ is the nth bit of the input word x, and (iii) $s_n$ determines if the selected addressable logic operator 36 will be the XNOR gate 40 or AND gate 52. Each bit cell 32 contains an addressable memory bit 34 (e.g., an active-low latch, a static RAM (SRAM) bit, or another type of memory bit) that stores the input $d_n$. The bit cells 32 contain an XNOR gate 40 and AND gate 52 as addressable logic operators 36 to perform multiplications between the input $x_n$ and the stored bit $a_{m,n}$, as well as a multiplexer 54, controlled by the input $s_n$ that selects the bit cell 32 operation.

The addressable memory bits 34 of the bit cells 32 are written if the address addr corresponding to that row 46 and the write enable signal wrEn are asserted; clock gates 56 and a storage multiplexer 58 are used to implement this functionality. Once the addressable memory bits 34 are written and the control signal $s_n$ has been fixed for each column, different input vectors x can be applied to the PPAC 26. Then, the bit cell 32 operation results are passed to the row ALU 38 (see FIG. 6A), which accumulates the outputs and performs additional operations. To improve the PPAC 26 scalability to large arrays, each row 46 of the CAM 30 is divided into $B_s$ subrows 48. Each subrow 48 performs a population count over results of its $V=N/B_s$ bit cells 32 using a local adder 42. With this partitioning scheme, the number of wires between each subrow 48 and the row ALU 38 decreases from V to $[\log_2(V+1)]$, where [□] is the ceiling function.

Figure 6B:
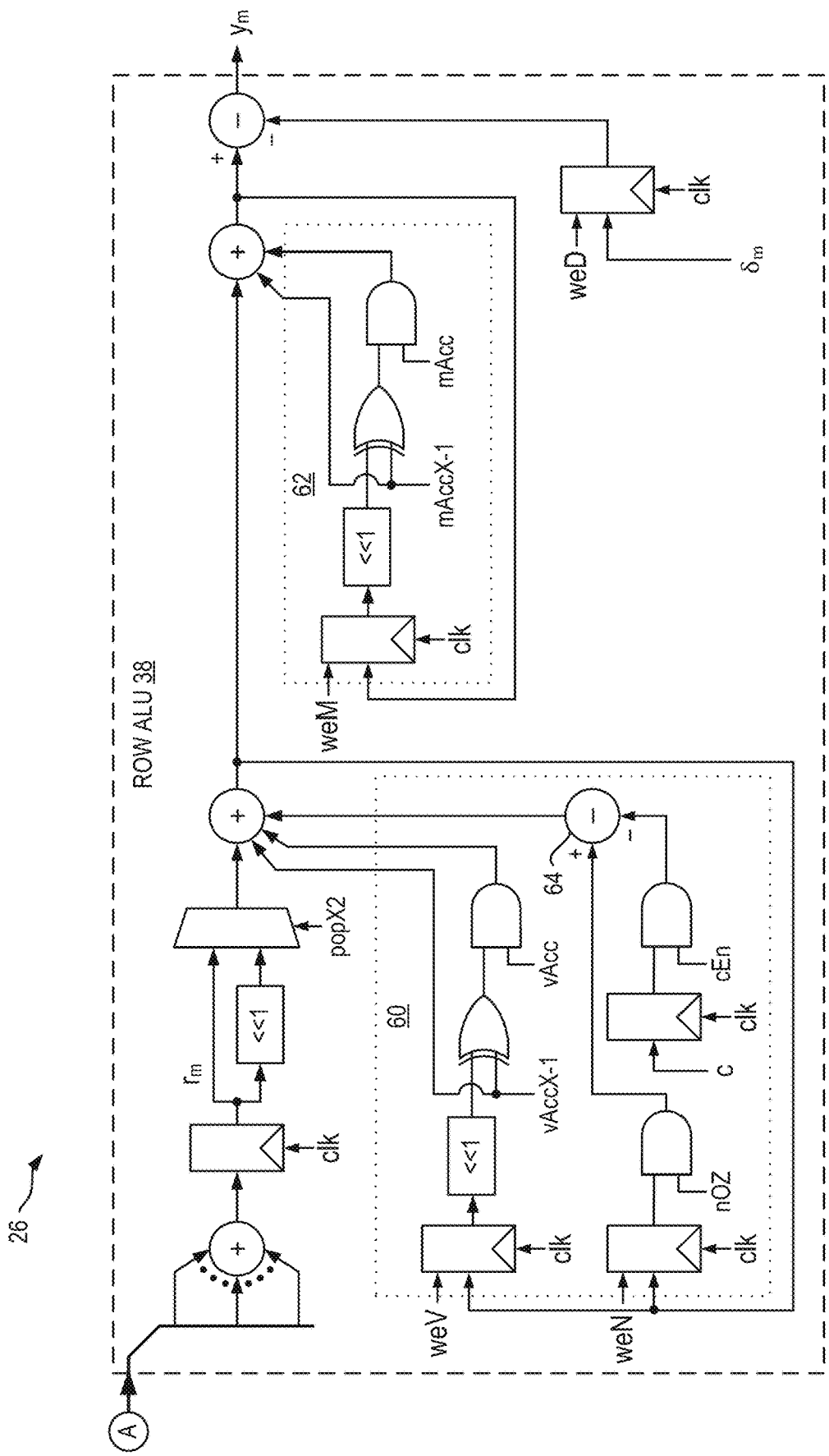
FIG. 6B illustrates details of a row arithmetic logic unit (ALU) of the embodiment of the PPAC of FIG. 5.

FIG. 6B illustrates details of the row ALU 38 of the embodiment of the PPAC 26 of FIG. 5. The row ALU 38 first adds the incoming local population counts of all subrows 48 and computes the total population count $r_m$ of the bit cell 32 results for the entire row 46. The result $r_m$ is then passed through two accumulators 60, 62. A first accumulator 60 is used in applications where the vector x has multi-bit entries. In this case, the MVP is carried out in a bit-serial fashion. An adder 64 of the first accumulator 60 also has an input to include an offset that can be used to adjust the row population count $r_m$ according to the application.

A second accumulator 62 is used in applications where the matrix A has multi-bit entries. A programmable threshold $\delta_m$ is then subtracted from the output of the second accumulator 62 to generate the output $y_m$ of the row ALU 38, whose interpretation depends on the operation mode. Note that the row ALU 38 contains two quantities that must be stored at configuration time: (i) The offset c used to correctly interpret $r_m$ and (ii) the threshold $\delta_m$. Finally, to increase the throughput of the PPAC 26, a pipeline stage is added after the row population count (e.g., using the bank adder 50 of FIG. 5).

III. Examples of PPAC Modes and Applications

With continuing reference to FIGS. 5, 6A, and 6B, this section describes example operating modes and applications of the proposed PPAC 26. In the following descriptions, it can be assumed that all the unspecified control signals in the row ALU 38 have a value of 0; write enable (wrEn) signals are set as required by the operation.

A. Hamming Similarity

In this mode, the PPAC 26 computes the Hamming similarity between the M words $a_m$, m=1, . . . , M, stored in each row 46 and the input word x. To this end, the bit cells 32 are configured to use the XNOR gate 40, so that the row population count $r_m$ corresponds to $\bar{h}(a_m,x)$. The row ALU 38 is configured to pass this result to the output of the PPAC 26 (by setting all control signals and $\delta_m$ to 0), so that $y_m = \bar{h}(a_m,x)$ is the Hamming similarity.

By setting $\delta_m=N$, the PPAC 26 can be used as a regular CAM. If all the bits of the stored word $a_m$ match the bits of x, then $r_m=N$; hence, $y_m=0$ and a match is declared. Otherwise, if $r_m<N$, then $y_m<0$. Thus, a complete-match can be declared by just looking at the MSB of the output $y_m$. By setting $0 \le \delta_m \le N$, the PPAC 26 declares a similarity-match whenever $\bar{h}(a_m,x) \ge \delta_m$. Note that the PPAC 26 performs M parallel Hamming-similarity computations in each clock cycle.

In this operation mode, the PPAC 26 can be used for applications that rely on CAMs, including network switches and routers, computer caches, and content-addressable parallel processors (CAPPs). In this mode, the PPAC 26 can also be used for particle track reconstruction and for locality-sensitive hashing (LSH), which enables computationally efficient approximate nearest neighbor search.

B. 1-Bit Matrix-Vector-Products

In this mode, the PPAC 26 computes one MVP y=Ax per clock cycle, where $y_m = \langle a_m, x \rangle$, m=1, . . . , M, and $a_m$ and x are both N-dimensional vectors with 1-bit entries. Detailed below are example embodiments of the PPAC 26 able to support different 1-bit number formats.

1. Matrix and Vector with {±1} Entries

In this configuration, the LO and HI logical levels are interpreted as −1 and +1, respectively, for both the matrix A stored in the PPAC 26 and the input vector x. Multiplication between a bit in $a_m$ (the mth row 46 of A) and a bit in x can be computed via the XNOR gate 40 of the bit cell 32. However, the row population count $r_m$ is an unsigned number in the range [0,N]. To obtain the inner product $\langle a_m, x \rangle$ from $r_m$, Equation 1 is used, which can be implemented in the row ALU 38 by setting cEn=1, c=N, and popX2 to double the row population count (by left-shifting $r_m$ once).

2. Matrix and Vector with {0,1} Entries

In this configuration, the LO and HI logical levels are interpreted as 0 and 1, respectively, for both the matrix and input vector. Multiplication between a bit in $a_m$ and a bit in x will be 1 only if both entries are 1; this corresponds to using the AND gate 52 in each bit cell 32. Hence, the row population count satisfies $r_m=\langle a_m, x \rangle$, which can be passed directly to the row ALU 38 output $y_m$.

3. Matrix with {±1} Entries and Vector with {0,1} Entries

In this configuration, the vector x is expressed as x=0.5 ($\hat{x}$+1), where $\hat{x}$ has {±1} entries and 1 is the all-ones vector. Note that $\hat{x}$ can be easily obtained by setting the entries of x that are 0 to −1; i.e., $\hat{x}$ and x are equivalent in terms of logical LO and HI levels. Equation 1 is used to obtain the following equivalence:

$$\langle a_m, x \rangle = \bar{h}(a_m, \hat{x}) + \bar{h}(a_m, 1) - N \quad \text{Equation 2}$$

This requires computation of $\bar{h}(a_m, 1)$, which can be obtained in the Hamming-similarity mode with input vector 1. The result of this operation is stored in the row ALU 38 by setting weN to 1. To complete Equation 2, the Hamming-similarity mode is applied again, but this time with x (which has the same logical representation as $\hat{x}$) as the input vector, and with n0Z and cEn set to 1 and c=N. Note that $\bar{h}(a_m, 1)$ needs to be computed once only if the matrix A changes.

4. Matrix with {0,1} Entries and Vector with {±1} Entries

In this configuration, the vector x is expressed as x=2$\tilde{x}$−1, where $\tilde{x}$ has {0,1} entries and, as above, has the same logical LO and HI levels as x. Noting that $\langle a_m, 1 \rangle = N - \bar{h}(a_m, 0)$, where 0 is the all-zeros vector, yields the following equivalence:

$$\langle a_m, x \rangle = 2\langle a_m, \tilde{x} \rangle + \bar{h}(a_m, 0) - N \quad \text{Equation 3}$$

As in Equation 2, this requires computation of $\bar{h}(a_m, 0)$, which can be obtained in the Hamming-similarity mode with input vector 0. The result of this operation is stored in the row ALU 38 (by setting weN to 1). One can then compute a 1-bit {0,1} MVP to obtain $\langle a_m, \tilde{x} \rangle$ for all rows 46 m=1, . . . , M of the PPAC 26, but this time with popX2, n0Z, and cEn set to 1, and c=N to complete Equation 3. As above, $\bar{h}(a_m, 0)$ has to be computed only if A changes.

1-bit {±1} MVPs can, for example, be used for inference of binarized neural networks. While 1-bit MVPs in the other number formats might have limited applicability, they are used for multi-bit operations as described next.

C. Multi-Bit Matrix-Vector-Products

In this mode, the PPAC 26 computes MVPs y=Ax where the entries of A and/or x have multiple bits. All of these multi-bit operations are carried out in a bit-serial manner, which implies that MVPs are computed over multiple clock cycles.

1. Multi-Bit Vector

Consider the case where A has 1-bit entries, while the vector x has L-bit entries. As a starting point:

$$x = \sum_{\ell=1}^{L} 2^{\ell-1} x_\ell \quad \text{Equation 4}$$

where $x_\ell$ is a 1-bit vector formed by the $\ell$th bit of all the entries of x. This decomposition enables rewriting of the MVP as follows:

$$= \sum_{\ell=1}^{L} 2^{\ell-1} A x_\ell \quad \text{Equation 5}$$

The 1-bit MVP mode of the PPAC 26 with input $x_L$ (the MSB of the entries of x) is used to compute $Ax_L$. The result is stored in the first accumulator 60 of the row ALU 38 by setting weV to 1. In the subsequent clock cycle, this value is doubled and added to $Ax_{L-1}$ by setting vAcc to 1. By repeating this operation for $\ell=L,L-1,\ldots 1$, the MVP y=Ax is computed bit-serially in L clock cycles.

2. Multi-Bit Matrix

Consider the case where each entry of A has K-bit entries. $A=\Sigma_{k=1}^{K} 2^{k-1} A_k$ can be decomposed, where $A_k$ is a 1-bit matrix formed by the kth bit of all entries of A. In contrast to the multi-bit vector case, the addressable memory bits 34 of the PPAC 26 cannot be replaced to contain a different matrix $A_k$ every cycle. Instead, different columns of the PPAC 26 are used for different bit-significance levels, so that all K bits of the entries of A are stored in the addressable memory bits 34. As a result, the PPAC 26 will now contain N/K different K-bit entries per row 46, instead of N different 1-bit entries per row 46. To ensure that only elements from $A_k$ are used, the columns with different significance are configured to use the AND gate 52, and the corresponding entry of x is set to 0, effectively nulling any contribution from these columns to the row population count $r_m$. The rest of the columns are configured according to the used number format, and c in the row ALUs 38 is set to N/K for the number formats that use it, so that the PPAC 26 computes $A_k x$ for an input x that has N/K entries of L bits.

The PPAC 26 starts by computing $A_K x$ (i.e., the MVP using the most significant bit of the entries of A) and saves the result in the second accumulator 62 of the row ALU 38 (by setting weM to 1), so that after L cycles (assuming each vector entry has L bits), it can double the accumulated result and add it to $A_{K-1} x$ by setting mAcc to 1. The new accumulated result is stored in the second accumulator 62, which will be written again L clock cycles later. By repeating this procedure, the multi-bit MVP y=Ax is computed bit-serially over KL clock cycles.

3. Multi-Bit Matrix

As detailed in Section III-B, the PPAC 26 is able to compute multi-bit MVPs with different number formats summarized in Table I.

TABLE I

L-BIT NUMBER FORMATS SUPPORTED BY PPAC

| Name | uint | int | oddint |
|---|---|---|---|
| LO level | 0 | 0 | -1 |
| HI level | 1 | 1 | 1 |
| Signed? | No | Yes | Yes |
| Min. value | 0 | $-2^{L-1}$ | $-2^L+1$ |
| Max. value | $2^L-1$ | $2^{L-1}-1$ | $2^L-1$ |
| E.g., L = 2 | {0, 1, 2, 3} | {-2, -1, 0, 1} | {-3, -1, 1, 3} |

For example, by mapping the logical LO level to 0 and HI to 1, multi-bit MVPs between unsigned numbers (uint) are performed. To operate with signed numbers (int), embodiments may negate (in 2's complement representation) the partial products $A_k x_L$ (for signed multi-bit vectors) or $A_K x$ (for signed multi-bit matrices), which are associated with the MSBs of the signed numbers in the vector x and matrix A, respectively. The row ALUs 38 can be configured to implement this behavior by setting vAccX-1 and mAccX-1 to 1 for a signed vector or matrix, respectively. The oddint number format arises from having a multi-bit number in which LO and HI get mapped to -1 and +1, respectively. Then, by applying (4), oddint represents signed odd numbers, as illustrated in Table I. Note that oddint cannot represent 0.

Low-resolution multi-bit MVPs using different number formats find widespread use in practice. For example, neural network inference can be executed with matrices and vectors using low-precision int numbers, where the threshold $\delta_m$ in the row ALU 38 can be used as the bias term of a fully-connected (dense) layer. A 1-bit oddint matrix multiplied with a multi-bit int vector can be used to implement a Hadamard transform, which finds use in signal processing, imaging, and communications applications.

D. GF(2) Matrix-Vector-Products

In this mode, the PPAC 26 is able to perform MVPs in GF(2), the finite field with two elements {0,1}. Multiplication in this field corresponds to an AND operation; addition corresponds to an XOR operation, which is equivalent to a simple addition modulo-2. GF(2) addition can then be performed by extracting the least significant bit (LSB) of a standard integer addition. To support MVPs in this mode, all of the columns of the PPAC 26 are set to use the AND gate 52 in the bit cells 32, and the row ALU 38 is configured so that $r_m=y_m$. Then, the result of $\langle a_m, x \rangle$ in GF(2) can be extracted from the LSB of $y_m$. Recent mixed-signal architectures that support MVPs are unable to support this mode as the LSBs of analog additions are generally not bit-true.

GF(2) MVPs find widespread application in the computation of substitution boxes of encryption systems, including the advanced encryption standard (AES), as well as in encoding and decoding of error-correction codes, such as low-density parity-check and polar codes.

E. Programmable Logic Array

In this mode, each bank 44 of the PPAC 26 is able to compute a Boolean function as a sum of min-terms, similar to a PLA. To this end, the mth row 46 computes a min-term as follows: Each PPAC 26 column and entry of the input vector x correspond to a different Boolean variable X; note that the complement $\overline{X}$ is considered as a different Boolean variable that is associated with another column and input entry. Then, if the Boolean variable associated with the nth column should appear in the min-term computed by the mth row 46, the $a_{m,n}$ bit cell 32 must store a logical 1, otherwise a logical 0. Furthermore, all PPAC 26 columns are set to use the AND gate 52, and the row ALU 38 is configured so that $y_m=r_m-\delta_m$, where the threshold $\delta_m$ must be the number of Boolean variables that are in the mth row's min-term (i.e., the number of logical 1's stored in $a_m$). By doing so, $y_m=0$ only if all of the Boolean variables in the min-term are 1; otherwise, $y_m<0$. This implies that the result of the min-term of the mth row 46 can be extracted from the complement of the MSB of $y_m$. Finally, the results of all min-terms in the bth bank are added together using the bank adder 50. If $p_b>0$, then at least one of the min-terms has a value of 1, so the output of the Boolean function programmed in the bank is a logical 1; otherwise, it is a logical 0.

Note that the PPAC 26 also supports different logic structures. For example, if $\delta_m=1$, then each row 46 will be computing a max-term. If the result of the Boolean function is interpreted to be 1 only if $p_b$ is equal to the number of programmed max-terms in the bank, the PPAC 26 effectively computes a product of max-terms. In general, the PPAC 26 can execute a logic function with two levels: The first stage can be a multi-operand AND, OR, or majority gate (MAJ) of the Boolean inputs; the second stage can be a multi-operand AND, OR, or MAJ of the outputs of the first stage. With this, the PPAC 26 can be used as a look-up table or programmed as a PLA that computes Boolean functions.

IV. Implementation Results

Presented below are post-layout implementation results of various PPAC 26 array sizes in 28 nm CMOS and a comparison to existing in-memory accelerators and other related designs.

A. Post-Layout Implementation Results

Disclosed below are four different M×N PPAC 26 arrays in 28 nm CMOS. All of these PPAC 26 implementations have banks 44 formed by sixteen rows 46, each with V=16 bit cells 32 per subrow 48, and a row ALU 38 that supports multi-bit operations with L and K up to 4 bits. Table II, below, summarizes example post-layout implementation results.

TABLE II

POST- LAYOUT IMPLEMENTATION RESULTS FOR DIFFERENT PPAC ARRAY SIZES IN 28 NM CMOS

| Words M | 16 | 16 | 256 | 256 |
|---|---|---|---|---|
| Word-length N | 16 | 256 | 16 | 256 |
| Banks B | 1 | 1 | 16 | 16 |
| Subrows $B_s$ | 1 | 16 | 1 | 16 |
| Area [µm²] | 14 161 | 72 590 | 185 283 | 783 240 |
| Density [%] | 75.77 | 70.45 | 72.52 | 72.13 |
| Cell area [kGE] | 17 | 81 | 213 | 897 |
| Max. clock freq. [GHz] | 1.116 | 0.979 | 0.824 | 0.703 |
| Power [mW] | 6.64 | 45.60 | 78.65 | 381.43 |
| Peak throughput [TOP/s] | 0.55 | 8.01 | 6.54 | 91.99 |
| Energy-eff. [fJ/OP] | 12.00 | 5.69 | 12.03 | 4.15 |

The throughput is measured in operations (OP) per second, where both 1-bit multiplications and 1-bit additions are counted as one OP each. Since each row 46 performs an inner product between two N-dimensional 1-bit vectors, an M×N PPAC 26 performs M(2N−1) OP per clock cycle. Even if the clock frequency decreases as dimensions of the PPAC 26 increase, the overall throughput increases up to 92 TOP/s for the 256×256 array; this occurs due to the massive parallelism of the disclosed PPAC 26 design. It is observed that increasing the number of words M results in a higher area and power consumption than increasing the number of bits per word N by the same factor. This behavior is due to the fact that adding a new row 46 implies including a new row ALU 38, whose area can be comparable to that of the row 46 memory. In contrast, increasing the number of bits per word N mainly modifies the datapath width of an existing row ALU 38, which scales only logarithmically in N, improving the energy-efficiency of the 256×256 PPAC 26 to 4.15 fJ/OP.

Table III, below, summarizes the throughput, power, and energy-efficiency for the different operation modes executed on a 256×256 PPAC 26.

TABLE III

THROUGHPUT, POWER, AND ENERGY-EFFICIENCY FOR DIFFERENT APPLICATIONS WITH A 256 × 256 PPAC ARRAY IN 28 NM CMOS

| Operation mode | Throughput [GMVP/s] | Power [mW] | Energy-eff. [pJ/MVP] |
|---|---|---|---|
| Hamming similarity | 0.703 | 478 | 680 |
| 1-bit {±1} MVP | 0.703 | 498 | 709 |
| 4-bit {0, 1} MVP | 0.044 | 226 | 5 137 |
| GF(2) MVP | 0.703 | 353 | 502 |
| PLA | 0.703 | 352 | 501 |

Throughput and energy-efficiency are measured in terms of MVPs, where for the Hamming-similarity mode, an MVP corresponds to the computation of M=256 Hamming similarities; for the PLA mode, an MVP computes B=16 distinct Boolean functions. To extract power estimates, Cadence Innovus was used, as was stimuli-based post-layout simulations at 0.9 V and 25° C.° in the typical-typical process corner. In the simulations, a randomly-generated matrix A was loaded into the addressable memory bits 34 of the PPAC 26, and then 100 random input vectors x applied for the 1-bit operations, while for the 4-bit {0,1} MVP case, 100 different MVPs were executed. The dynamic and static power consumption of the PPAC 26 were simulated only while performing computations (i.e., the power consumption of initializing the matrix A was excluded), as this is the envisioned use case for the PPAC 26—applications in which the matrix A remains largely static but the input vectors x change at a fast rate. From Table III, it can be observed that operations that use the XNOR gate 40 (i.e., Hamming similarity and 1-bit {±1} MVP) exhibit higher power consumption than tasks relying on the AND gate 52; this is because the switching activity at the output of XNOR gates 40 is, in general, higher than that of AND gates 52.

B. Comparison with Existing Accelerators

In Table IV, the 256×256 PPAC 26 was compared with existing hardware accelerators that have been specialized for binarized neural network (BNN) inference and support fully-connected layers.

TABLE IV

COMPARISON WITH EXISTING BINARIZED NEURAL NETWORK (BNN) ACCELERATOR DESIGNS

| Design | PIM? | Mixed signal? | Implementation | Technology [nm] | Supply [V] | Area [mm²] | Peak TP [GOP/s] | Energy-eff. [TOP/s/W] | Peak TP[a] [GOP/s] | Energy-eff.[a] [TOP/s/W] |
|---|---|---|---|---|---|---|---|---|---|---|
| PPAC | yes | no | layout | 28 | 0.9 | 0.78 | 91994 | 184 | 91994 | 184 |
| CIMA [6] | yes | yes | silicon | 65 | 1.2 | 8.56 | 4720 | 152 | 10957 | 1456 |
| Bankman et al. [19] | no | yes | silicon | 28 | 0.8 | 5.95 | — | 532 | — | 420 |
| BRein [10] | yes | no | silicon | 65 | 1.0 | 3.9 | 1.38 | 2.3 | 3.2 | 15 |

TABLE IV-continued

COMPARISON WITH EXISTING BINARIZED NEURAL NETWORK (BNN) ACCELERATOR DESIGNS

| Design | PIM? | Mixed signal? | Implementation | Technology [nm] | Supply [V] | Area [mm$^2$] | Peak TP [GOP/s] | Energy-eff. [TOP/s/W] | Peak TP$^a$ [GOP/s] | Energy-eff.$^a$ [TOP/s/W] |
|---|---|---|---|---|---|---|---|---|---|---|
| UNPU [23] | no | no | silicon | 65 | 1.1 | 16 | 7372 | 46.7$^b$ | 17114 | 376 |
| XNE [24] | no | no | layout | 22 | 0.8 | 0.016 | 108 | 112 | 84.7 | 54.6 |

$^a$Technology scaling to 28 nm CMOS at V$_{dd}$ = 0.9 V assuming standard scaling rules A~1/l$^2$ · t$_{pd}$~1/l, and P$_{dyn}$~1/(V$_l^{-2}$l).
$^b$Number reported in [23, FIG. 13]; note that the peak TP (7372 GOP/s) divided by the reported power consumption (297 mW) yields 24.8 TOP/s/W.

These designs were compared against, as their operation closely resembles that of the 1-bit {±1} MVP operation mode. In fact, all of the considered designs count 1-bit products and additions as one operation (OP) each—an inner product between two N-dimensional 1-bit vectors is 2N OPs. Some current designs are PIM accelerators in which part of the computation is carried out within the bit cells 32 or rely on mixed-signal techniques to compute MVPs.

By considering technology scaling, it was seen that the energy efficiency (in terms of TOP/s/W) of the PPAC 26 is comparable to other fully-digital designs but 7.9 times and 2.3 times lower than conventional mixed-signal designs, respectively, where the latter is implemented in a comparable technology node as the PPAC 26. As noted in Section III-D, mixed-signal designs are particularly useful for tasks that are resilient to noise or process variation, such as neural network inference. However, mixed-signal designs cause issues in applications that require bit-true results, such as addition in GF(2), which requires the LSB of an integer addition to be exact.

It was also seen that the PPAC 26 achieved the highest peak throughput among the considered designs, which is due to its massive parallelism. It is to be emphasized, however, that the PPAC 26 performance was extracted from post-layout simulations, whereas all the other designs are silicon-proven. Furthermore, all other designs not only execute 1-bit MVPs, but they also include other operations that are required to implement BNN inference, such as activation functions and batch normalization. The PPAC 26, in contrast, executes a 256×256 MVP followed by adding a bias vector, which is a large portion of the operations required to process a fully-connected BNN layer. As a result, the reported throughput and energy-efficiency for the PPAC 26 are based on simulations.

It is to be reiterated that the PPAC 26 is a massively-parallel PIM engine that can be used for a number of different MVP-like operations, where 1-bit MVP is just one of them. As such, the main purpose of the comparison in Table IV is to demonstrate that the 1-bit {±1} MVP operation mode holds promise with an energy-efficiency that is comparable to that of other accelerators. While some hardware designs are specialized to carry out 1-bit MVPs and some designs are specialized to execute multi-bit MVPs for neural network inference, the PPAC 26 is programmable to perform not only these operations, but also GF(2) MVPs, Hamming-similarity computations, and PLA or CAM functionality, opening up its use in a wide range of applications. In this sense, the PPAC 26 replaces current implementations where PIM is used to accelerate multiple applications, such as database query processing, cryptographic kernels, and in-memory checkpointing. In some embodiments, the PPAC 26 will be integrated into a system. In some implementations used to compute MVPs, an element-wise multiplication between two vectors whose entries are L-bit requires L$^2$+5 L−2 clock cycles, which is a total of 34 clock cycles for 4-bit numbers. Then, the reduction (via sum) of an N-dimensional vector with L-bits per entry requires $\mathcal{O}$ (L log$_2$(N)) clock cycles, which is at least 64 clock cycles for a 256-dimensional vector with 8-bit entries (as the product of two 4-bit numbers results in 8-bit). Hence, an inner product between two 4-bit vectors with 256 entries requires at least 98 clock cycles. By contrast, some embodiments of the PPAC 26 require only 16 clock cycles for the same operation. This significant difference in the number of clock cycles is caused by the fact that while some conventional designs are geared towards data-centric applications in which element-wise operations are performed between high-dimensional vectors to increase parallelism, the PPAC 26 aims at accelerating a wide range of MVP-like operations, one of the reasons why embodiments herein included dedicated hardware (such as the row pop-count) to speed up element-wise vector multiplication and vector sum-reduction.

V. Flow Diagram for Performing Logic Functions in Memory

Figure 7:
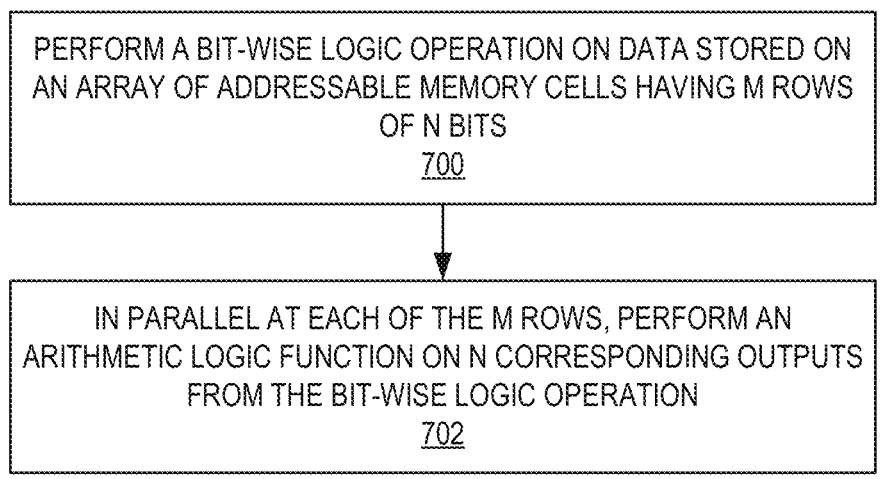
FIG. 7 is a flow diagram illustrating a process for performing logic functions in memory.

FIG. 7 is a flow diagram illustrating a process for performing logic functions in memory. The process begins at operation 700, with performing a bit-wise logic operation on data stored on an array of addressable memory cells having M rows of N bits. The process continues at operation 702, with, in parallel at each of the M rows, performing an arithmetic logic function on N corresponding outputs from the bit-wise logic operation.

VI. Implementation for Wireless Communications

Figure 8A:
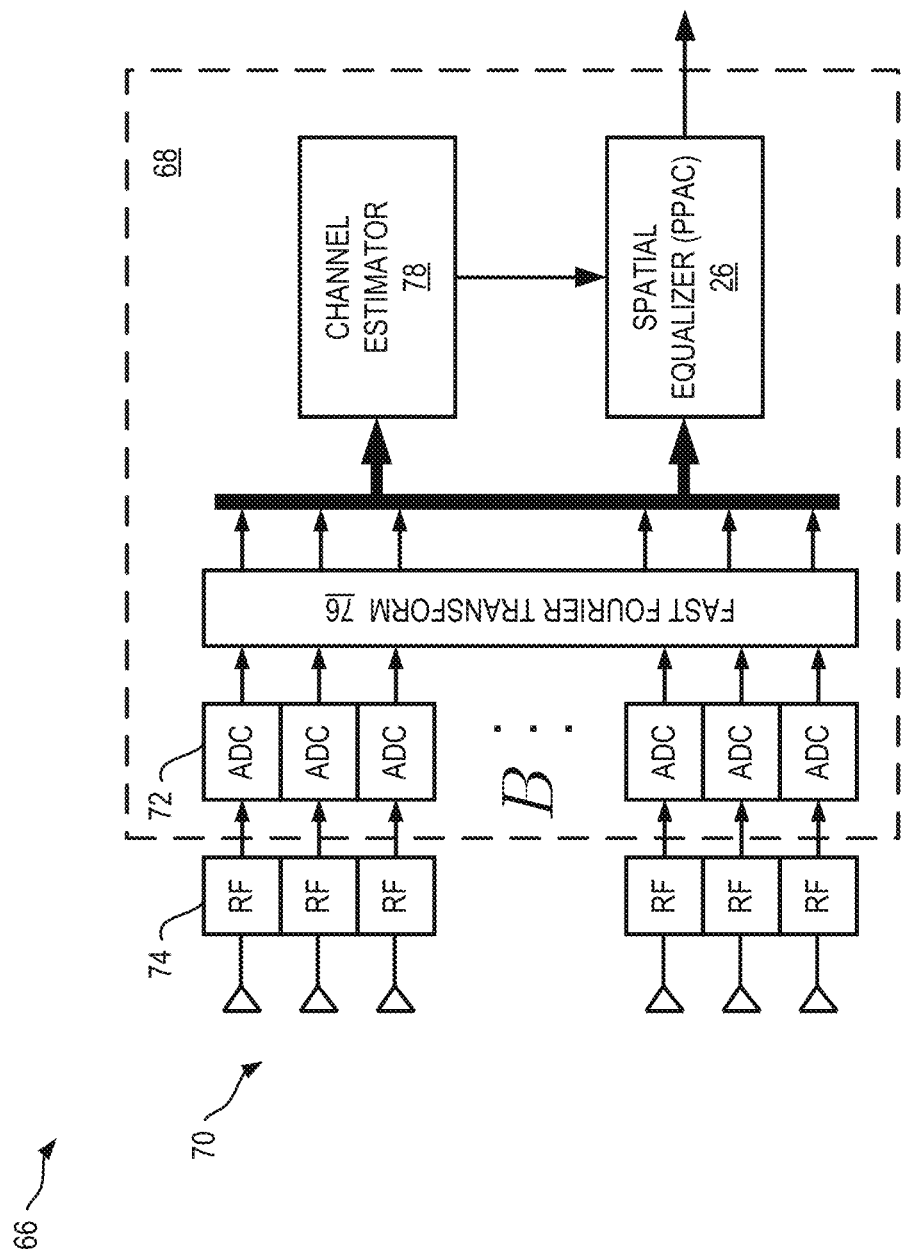
FIG. 8A is a schematic diagram of an embodiment of the PPAC of FIG. 5 implemented in a wireless communications system, such as a radio access node.

FIG. 8A is a schematic diagram of an embodiment of the PPAC 26 of FIG. 5 implemented in a wireless communications system 66. The PPAC 26 is implemented as a spatial equalizer in baseband processing circuitry 68. In an exemplary aspect, the wireless communications system 66 can be any node in a radio access network (RAN) (e.g., a cellular communications network) which can transmit and/or receive radio frequency (RF) signals. In some examples, the wireless communications system 66 is a base station (e.g., a New Radio (NR) base station (gNB) in a Third Generation Partnership Project (3GPP) Fifth Generation (5G) NR network), a low-power base station (e.g., a micro base station or a pico base station), an access point (e.g., for IEEE 802.11 wireless LAN), or a relay node.

In an exemplary aspect, the wireless communications system 66 includes an antenna array 70 (e.g., having B antennas), which can be operated for multi-user, multiple input, multiple output (MU-MIMO) communication. Accordingly, the wireless communications system 66 can be configured to perform spatial equalization in uplink communications (e.g., communications from a user equipment (UE) to a core network). The purpose of spatial equalization is to beamform received signals by collecting the signals at B antennas of the antenna array 70, while suppressing interference (e.g., inter-UE interference).

In an exemplary aspect, the baseband processing circuitry 68 is implemented as an ASIC in CMOS technology. The baseband processing circuitry 68 includes an array of successive-approximation-register (SAR) analog-to-digital converters (ADCs) 72 (e.g., connected to RF receivers 74), a fast Fourier transform (FFT) engine 76, a channel estimator 78, and a spatial equalizer. The spatial equalizer is implemented using a specialized variant of the PPAC 26 described herein.

The SAR ADCs 72 convert the analog signals sampled at the base-station (e.g., wireless communications system 66) antenna array 70. The channel estimator 78 obtains the information required to compute a spatial equalization matrix, which is stored in memory of the PPAC 26. The FFT engine 76 allows the PPAC 26 to operate in either beamspace or the conventional antenna domain, where the latter corresponds to taking the outputs directly from the SAR ADCs 72. The PPAC 26 then multiplies an equalization matrix stored on its memory with the signals coming from the SAR ADCs 72 (which might have been converted into beamspace by the FFT engine 76).

Figure 8B:
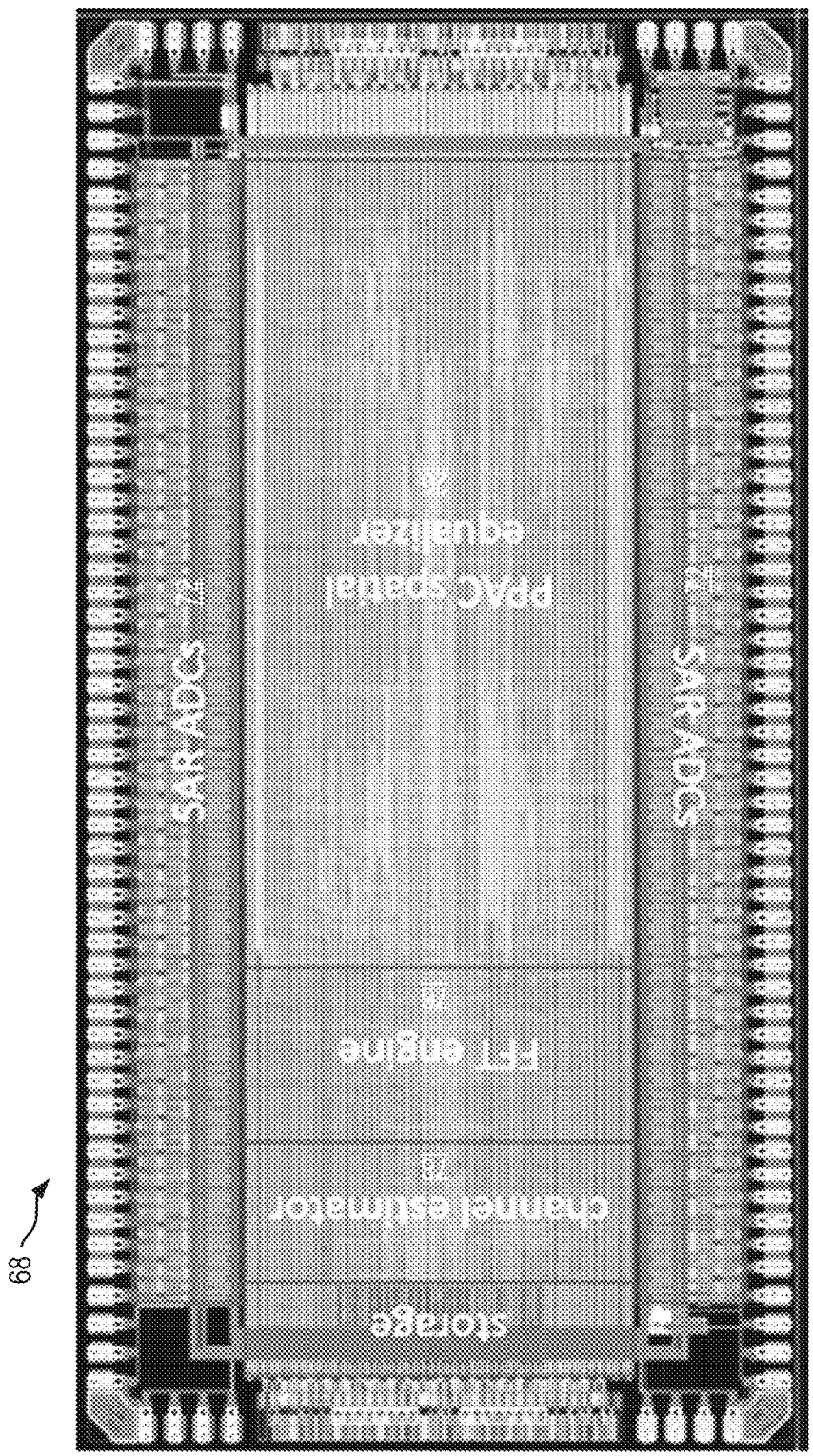
FIG. 8B illustrates an application-specific integrated circuit (ASIC) layout of baseband processing circuitry of FIG. 8A.

FIG. 8B illustrates the ASIC layout of the baseband processing circuitry 68 of FIG. 8A. A key highlight of the implemented ASIC is the tight coupling between the SAR ADCs 72 and the PPAC 26 spatial equalizer. This tight integration arises naturally given the bit-serial nature of both the SAR ADCs 72 and the PPAC 26 architecture: In each clock cycle, each SAR ADC 72 produces a new bit of the sampled analog signal, which is then immediately processed by the PPAC 26. This is in stark contrast with traditional bit-parallel architectures, which would first wait several clock cycles for the SAR ADC 72 conversion to finish, and then process all converted bits in one or multiple clock cycles.

The PPAC 26 offers superior area- and energy-efficiency when compared with traditional bit-parallel architectures that perform low-resolution MVPs. The implemented PPAC 26 of FIGS. 8A-8B is configurable to support different operand precision. The implemented PPAC 26 processes signals from 32 antennas, enables transmission of up to 16 UEs, and operates with matrices having up to 4 bits, and vectors having up to 6 bits. Finally, to achieve higher throughput, four parallel instances of the PPAC 26 are used, each one equipped with its own set of time-multiplexed SAR ADCs 72.

Those skilled in the art will recognize improvements and modifications to the preferred embodiments of the present disclosure. All such improvements and modifications are considered within the scope of the concepts disclosed herein and the claims that follow.

What is claimed is:

1. A parallel processor, comprising:
a plurality of bit cells, each bit cell comprising:
an addressable memory bit; and
a first addressable logic operator connected to the addressable memory bit; and
a first arithmetic logic unit (ALU) configured to compute
a first function of outputs from the first addressable logic operators of the plurality of bit cells,
wherein the first function of the first ALU is configurable from a group of functions.

2. A parallel processor, comprising:
a plurality of bit cells, each bit cell comprising:
an addressable memory bit; and
a first addressable logic operator connected to the addressable memory bit; and
a first arithmetic logic unit (ALU) configured to compute
a first function of outputs from the first addressable logic operators of the plurality of bit cells,
wherein the first ALU is further configured to compute a second function in parallel time with the first function.

3. A parallel processor, comprising:
a plurality of bit cells, each bit cell comprising:
an addressable memory bit; and
a first addressable logic operator connected to the addressable memory bit; and
a first arithmetic logic unit (ALU) configured to compute
a first function of outputs from the first addressable logic operators of the plurality of bit cells,
wherein the first ALU is further configured to compute a second function in serial time with the first function.

4. A parallel processor, comprising:
a plurality of bit cells, each bit cell comprising:
an addressable memory bit; and
a first addressable logic operator connected to the addressable memory bit; and
a first arithmetic logic unit (ALU) configured to compute
a first function of outputs from the first addressable logic operators of the plurality of bit cells,
wherein the first function of the first ALU comprises a programmable threshold function.

5. A parallel processor, comprising:
a plurality of bit cells, each bit cell comprising:
an addressable memory bit; and
a first addressable logic operator connected to the addressable memory bit; and
a first arithmetic logic unit (ALU) configured to compute
a first function of outputs from the first addressable logic operators of the plurality of bit cells;
wherein the plurality of bit cells comprises a first row of bit cells;
wherein the first ALU is connected to the first row of bit cells; and
wherein the first function of the first ALU comprises a matrix vector product operation.

6. The parallel processor of claim 5, wherein:
the plurality of bit cells further comprises a second row of bit cells; and
the parallel processor further comprises a second ALU connected to the second row of bit cells.

7. The parallel processor of claim 6, wherein the first ALU and the second ALU are configured to provide one of a single-bit matrix-vector product or a multi-bit matrix-vector product from a multi-bit matrix.

8. A parallel processor, comprising:
a plurality of bit cells, each bit cell comprising:
an addressable memory bit; and
a first addressable logic operator connected to the addressable memory bit; and
a first arithmetic logic unit (ALU) configured to compute
a first function of outputs from the first addressable logic operators of the plurality of bit cells,
wherein each bit cell further comprises
a second addressable logic operator coupled to the addressable memory bit and a multiplexer selectively providing a corresponding output from the first addressable logic operator or the second addressable logic operator.

9. The parallel processor of claim 8, wherein:
the first addressable logic operator comprises XNOR; and
the second addressable logic operator comprises XOR, OR, NOR, AND, or NAND.

10. The parallel processor of claim 8, wherein:
the first addressable logic operator comprises an XNOR gate;
the second addressable logic operator comprises an AND gate; and
the multiplexer is coupled to the XNOR gate, the AND gate, and a control signal input.

11. The parallel processor of claim 10, wherein:
the XNOR gate performs a first bitwise multiplication $\{\pm 1\}$ between an input bit and a stored bit; and
the AND gate performs a second bitwise multiplication $\{0, 1\}$ between the input bit and the stored bit.

12. The parallel processor of claim 1, further comprising:
a memory module comprising the addressable memory bits of the plurality of bit cells; and
a processing module communicatively coupled to the memory module and comprising the first ALU, additional ALUs and the first addressable logic operators of the plurality of bit cells.

13. A memory device for performing logical operations, the memory device comprising:
a plurality of rows of bit cells comprising content-addressable memory; and
a plurality of row arithmetic logic units (ALUs), each row ALU being communicatively coupled to a respective one of the plurality of rows of bit cells;
wherein each row ALU is configured to perform an operation on outputs from the respective one of the plurality of rows of bit cells;
wherein each of the plurality of rows of bit cells is subdivided into a plurality of subrows; and
wherein each row ALU adds incoming local population counts of all subrows in the respective row and computes the operation based on a total population count of bit cell results for the respective row.

14. The memory device of claim 13, further comprising a plurality of subrow adders to perform a population count for each respective subrow of the plurality of subrows.

15. A memory device for performing logical operations, the memory device comprising:
a plurality of rows of bit cells comprising content-addressable memory;
a plurality of row arithmetic logic units (ALUs), each row ALU being communicatively coupled to a respective one of the plurality of rows of bit cells;
a plurality of memory banks, each comprising a subset of the plurality of rows of bit cells; and
a plurality of bank adders to sum an output from respective ALUs in each of the plurality of memory banks;
wherein each row ALU is configured to perform an operation on outputs from the respective one of the plurality of rows of bit cells.

16. A method for performing logic functions in memory, the method comprising:
performing a bit-wise logic operation on data stored on an array of addressable memory cells having M rows of N bits; and
in parallel at each of the M rows, performing an arithmetic logic function on N corresponding outputs from the bit-wise logic operation, wherein the bit-wise logic operation comprises a Hamming distance computation.

17. The method of claim 16, wherein:
the bit-wise logic operation further comprises an inner-product computation; and
the arithmetic logic function comprises a sum of the N corresponding outputs.

* * * * *